United States Patent
Tran et al.

(10) Patent No.: US 7,697,365 B2
(45) Date of Patent: Apr. 13, 2010

(54) SUB VOLT FLASH MEMORY SYSTEM

(75) Inventors: Hieu Van Tran, San Jose, CA (US);
Sang T Nguyen, Union City, CA (US);
Anh Ly, San Jose, CA (US); Hung Q. Nguyen, Fremont, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 305 days.

(21) Appl. No.: 11/777,895

(22) Filed: Jul. 13, 2007

(65) Prior Publication Data
US 2009/0016106 A1    Jan. 15, 2009

(51) Int. Cl.
*G11C 8/00* (2006.01)
(52) U.S. Cl. .............................. 365/230.06; 365/185.27
(58) Field of Classification Search ............ 365/230.06, 365/185.27
See application file for complete search history.

(56) References Cited

U.S. PATENT DOCUMENTS

| | | | |
|---|---|---|---|
| 6,088,267 A * | 7/2000 | Atsumi et al. ........... | 365/185.23 |
| 6,282,145 B1 | 8/2001 | Tran et al. | |
| 7,009,243 B2 * | 3/2006 | Ishii et al. .................... | 257/315 |
| 7,447,104 B2 * | 11/2008 | Leung ................... | 365/230.06 |
| 7,453,737 B2 * | 11/2008 | Ha ......................... | 365/185.33 |
| 2003/0103406 A1 | 6/2003 | Tran et al. | |
| 2007/0081389 A1 | 4/2007 | Tran et al. | |

OTHER PUBLICATIONS

U.S. Appl. No. 11/655,901, filed Jan. 2007, Hieu Van Tran.

* cited by examiner

*Primary Examiner*—Son Dinh
*Assistant Examiner*—Nam T. Nguyen
(74) *Attorney, Agent, or Firm*—DLA Piper LLP (US)

(57) ABSTRACT

Various circuits include MOS transistors that have a bulk voltage terminal for receiving a bulk voltage that is different from a supply voltage and ground. The bulk voltage may be selectively set so that some MOS transistors have a bulk voltage set to the supply voltage or ground and other MOS transistors have a bulk voltage that is different. The bulk voltage may be set to forward or reverse bias pn junctions in the MOS transistor. The various circuits include comparators, operational amplifiers, sensing circuits, decoding circuits and the other circuits. The circuits may be included in a memory system.

21 Claims, 13 Drawing Sheets

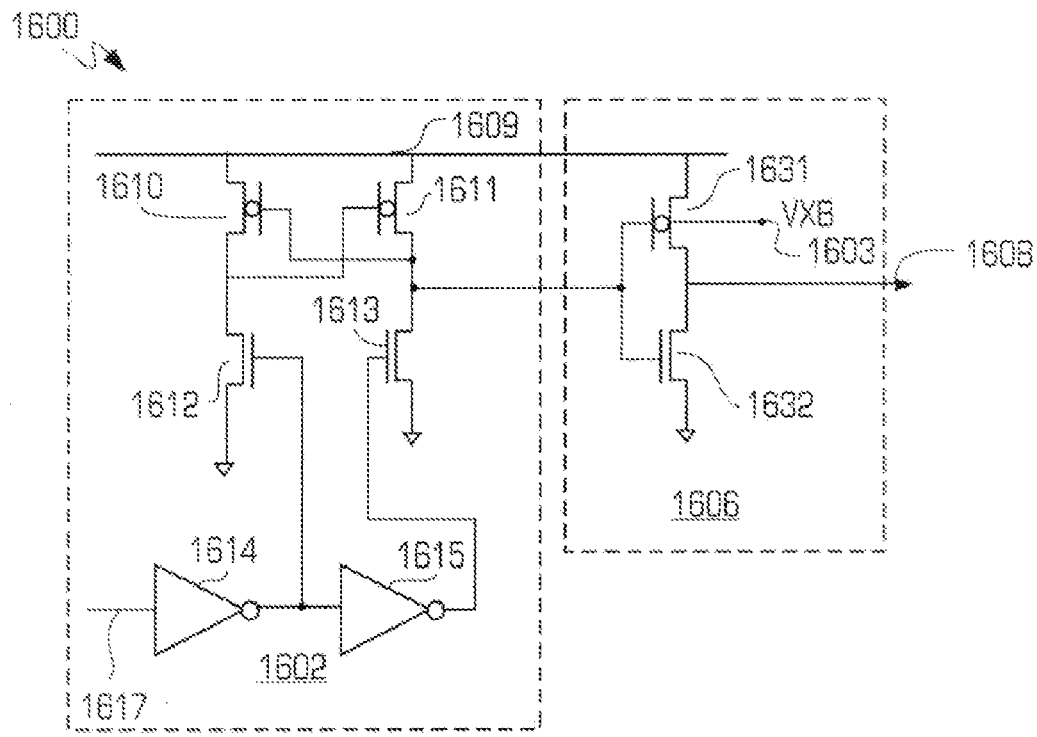
FIG. 16
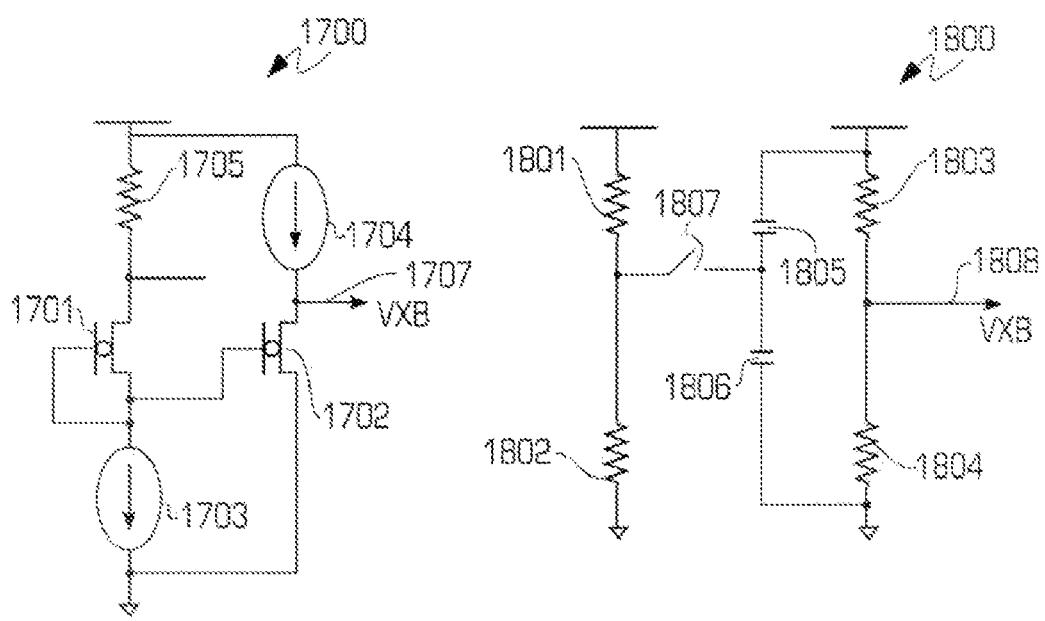
FIG. 17
FIG. 18

US 7,697,365 B2

SUB VOLT FLASH MEMORY SYSTEM

TECHNICAL FIELD

The present invention relates to a circuits operating at sub volt levels, and more particularly, to a memory system operating at sub volt levels.

BACKGROUND

Reducing power consumption of electronic devices is desirable. One approach to reducing power consumption is to reduce the operating voltages of semiconductor circuits in the electronic devices. Faster semiconductor circuits are also desirable. Lower operating voltages may also provide faster circuits. However, lower operating voltages provide less margins for circuit elements.

SUMMARY

A system includes MOS transistors that have a bulk voltage terminal for receiving a bulk voltage that is different from a supply voltage and ground. The bulk voltage may be selectively set so that some MOS transistors have a bulk voltage set to the supply voltage or ground and other MOS transistors have a bulk voltage that is different. The bulk voltage may be set to forward or reverse bias pn junctions in the MOS transistor.

In various aspects, the bulk voltage that is different for different MOS transistors may be included in comparators, operational amplifiers, sensing circuits, decoding circuits and the other circuits in a memory system. In other aspects, the dimensions of the MOS transistors and the voltages applied thereto may provide bipolar action in the MOS transistors.

BRIEF DESCRIPTION OF THE DRAWINGS

FIG. 16 is a schematic diagram illustrating an x-decoder with level shifting.

FIG. 17 is a schematic diagram illustrating a voltage generator for generating a bulk bias with limited current of the x-decoder of FIG. 16.

FIG. 18 is a schematic diagram illustrating a voltage generator for generating a bias voltage using resistor dividers and a capacitor divider.

DETAILED DESCRIPTION

Figure 1A:
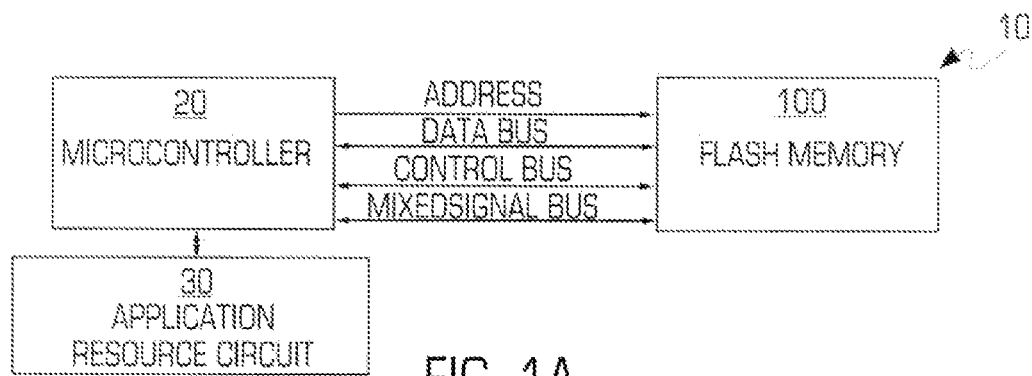
FIG. 1A is a block diagram illustrating an integrated system-on-chip (SOC) microcontroller memory system consistent with aspects of the present invention.

FIG. 1A is a block diagram illustrating an exemplary integrated system-on-chip (SOC) microcontroller memory system 10 according to the present invention. The SOC microcontroller memory system 10 includes a digital multilevel bit memory array system 100, a microcontroller 20, and an application resource circuit 30 (e.g., a circuit or block of circuitry that may be devoted to a particularized application). A system bus includes address, data, control, and mixed signal bus (which may include digital control, clock lines, power lines, and analog signal lines). The digital multilevel bit memory array system 100 is described below in conjunction with FIG. 1B, serves as a code and data storage for the system 10. The microcontroller 20 may be, for example, an 8-bit microcontroller such as industry standard 8051, a RISC core, or a 32 bit ARM controller. The application resource circuit 30 may include Analog-to-Digital Converters (ADCs) and/or Digital-to-Analog Converter (DACs), (crystal oscillator) (XTAL), phase lock loop (PLL), voltage regulators, bandgap reference, Power-On-Reset (POR) circuit, VDD-detector (for power brown-out detection, detecting invalid VDD level to avoid invalid chip operation), TempSensor (temperature sensor to sense chip temperature), V/I-Mon (voltage and current monitor), P-Mon (Power monitor to monitor chip power consumption) and the like. The application resource circuit 30 may also include logic elements (LE) such as CLB (configurable logic block), SLB (spare logic block), PLA (programmable logic array), ROM table, gate array, and the like. These mixed logic blocks may be used to provide additional programmable logic function, such as security protocol or IO interface protocol control, in addition to those of the microcontroller 20. In one embodiment, the flash system 100 interfaces with the application resource circuit 30 using the ADC and DAC to generate high voltage program, erase, and sensing biases (such as described in U.S. Pat. No. 6,788,608 by Tran et al.), and using clock signals for charge pumping and for program, erase, read, and IO burst algorithm control. In another embodiment, the microcontroller 20 provides security function for the flash system 100 (such as chip password protection, memory sector tag bit, user ID code, memory block or sector non-volatile or volatile protection, data encryption and decryption) and error detection and correction (such as parity check, Hamming code, cyclic codes). In another embodiment, the microcontroller 20 and application resource circuit 30 uses the high voltage output (typically 10-20V) of the charge pump of the flash memory 100 for providing voltage overdrive for switches and big drivers to reduce impedance.

Figure 1B:
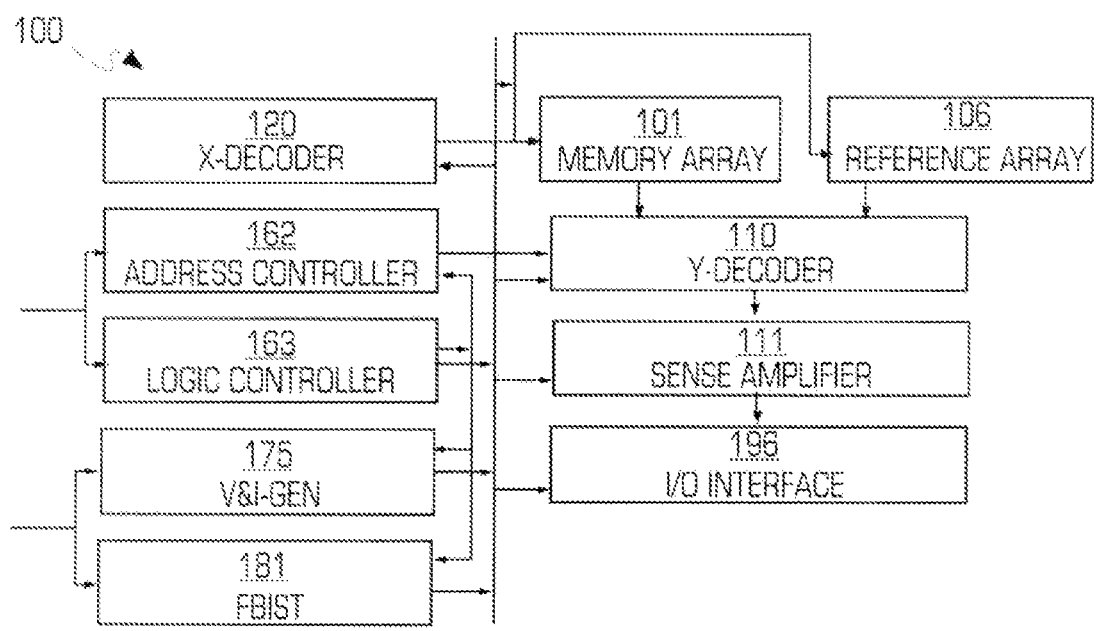
FIG. 1B is a block diagram illustrating a digital multilevel bit memory system of the SOC microcontroller memory system of FIG. 1A.

FIG. 1B is a block diagram illustrating an exemplary digital multilevel bit memory array system 100 consistent with one or more aspects related to the present invention. The digital multilevel bit memory array system 100 of FIG. 1B comprises a memory array 101 that includes a plurality of memory cells (not shown) and a reference memory array 106 that includes a plurality of reference memory cells (not shown). An N bit digital multilevel cell is defined as a memory cell capable of storing the $2^N$ levels. The reference array 106 is used as a reference system of reference voltage levels to verify the contents of the memory array 101. In another embodiment, the memory array 101 may include reference memory cells for storing the reference voltage levels.

In one embodiment, the memory array 101 and the reference array 106 include a drain side injection flash technology, which uses lower power in hot electron programming, and efficient injector based Fowler-Nordheim tunneling erasure. The programming may be done by applying a high voltage on the drain of the memory cell, a bias voltage on the control gate of the memory cell, and a bias current on the source of the memory cell. The programming in effect places electrons on the floating gate of memory cell. The erase is done by applying a high voltage on the control gate of the memory cell and a low voltage on the drain and/or source of the memory cell. The erase in effect removes electrons from the floating gate of memory cell. The verify (sensing or reading) is done by placing the memory cell in a voltage mode sensing, e.g., a bias voltage on the source, a bias voltage on the gate, a bias current coupled from the source (bitline) to a low bias voltage such as ground, and the voltage on the source is the readout cell voltage VCELL. The bias current may be independent of the data stored in the memory cell. In another embodiment, the verify (sensing or reading) is done by placing the memory cell in a current mode sensing, e.g., a low voltage on the source, a bias voltage on the gate, a load (resistor or transistor) coupled to the source (bitline) from a high voltage supply, and the voltage on the load is the readout voltage. In one embodiment, the array architecture and operating methods may be consistent with those disclosed in U.S. Pat. No. 6,282,145, entitled "Array Architecture and Operating Methods for Digital Multilevel Nonvolatile Memory Integrated Circuit System" by Tran et al., and/or U.S. Pat. No. 7,139,196, entitled "Sub-Volt Sensing For Digital Multilevel Memory" by Tran, and/or U.S. patent application Ser. No. 11/235,901, U.S. Published Patent Application 2007/0070703 A1, entitled "Flash Memory Array System including Top Gate Memory Cell" By Tran et al., which are incorporated herein by reference in their entirety.

The multilevel memory cells of the memory array 101 may be arranged in various ways, such as in rows and columns or in segments. Various addressing schemes may be used which organize the memory cells into bytes, pages or other arrangements.

The digital multilevel bit memory array system 100 further includes an x-decoder 120, a y-decoder 110, an address controller 162, a sense amplifier circuit 111, and an intelligent input/output interface 196. The y-decoder 110 controls bitlines (not shown) coupled to columns in memory cells and the reference voltage cells, during a write, read (or verify), and erase operations. The sense amplifier 111 senses the read data which is provided to the I/O interface 196. The I/O interface 196 also buffers input into the memory array system 100. The sense amplifier 111 also senses the read data and verifies the read data against input data during memory programming or erasing.

In response to address and other control signals, the address controller 162 decodes the address signal and controls page, byte, segment or other addressing for the x-decoder 120 and the y-decoder 110. The x-decoder 120 selects a row or a block of rows in the arrays 101 and 106 based on the signals from the address controller 162 and provides precise multilevel bias values over temperature, process, and power supply used for consistent single level or multilevel memory operation for the memory array 101.

The system 100 includes a logic controller 163 to control various chip functionality and to interface with the application resource circuit 30 and the microcontroller 20.

The system 100 includes a voltage/current generator (V&I-GEN) 175 to generate biases for program, erase and read operations. The V&I-GEN 175 may interface with the application resource circuit 30, for example, by using the ADC and DAC for biases and pulse-shape generation and the phase lock loop and the crystal oscillator for clock sources.

The system 100 includes a flash built-in self test (FBIST) 181 that is used to test on-chip non-volatile program and erase function, redundancy self repair, addressing uniqueness, defect open/short screening for bitline, wordline or sourceline, memory cell terminal leakage test (such as bitline, wordline or sourceline), power consumption test (standby or active), disturb screening, infant mortality screening, margin screening, at-speed test, and the like.

The system 100 further includes power related circuits (not shown), such as band gap voltage generators, charge pumps, voltage regulators, and power management systems, and other control circuits (not shown) such as voltage algorithm controllers.

The system 100 may execute various operations on the memory array 101. An erase operation may be done to erase all selected multilevel cells by removing the charge on selected memory cells according to the operating requirements of the non-volatile memory technology used. A data load operation may be used to load in a plurality of bytes of data to be programmed into the memory cells, e.g., 0 to 512 bytes in a page. A read operation may be done to read out in parallel a plurality of bytes of data if the data (digital bits), e.g., 512 bytes within a page, stored in the multilevel cells. A program operation may be done to store in parallel a plurality of bytes of data in (digital bits) into the multilevel cells by placing an appropriate charge on selected multilevel cells depending on the operating requirements of the non-volatile memory technology used. The operations on the memory may be, for example, consistent with the operations described in U.S. Pat. No. 6,282,145, incorporated herein by reference above.

Figure 2:
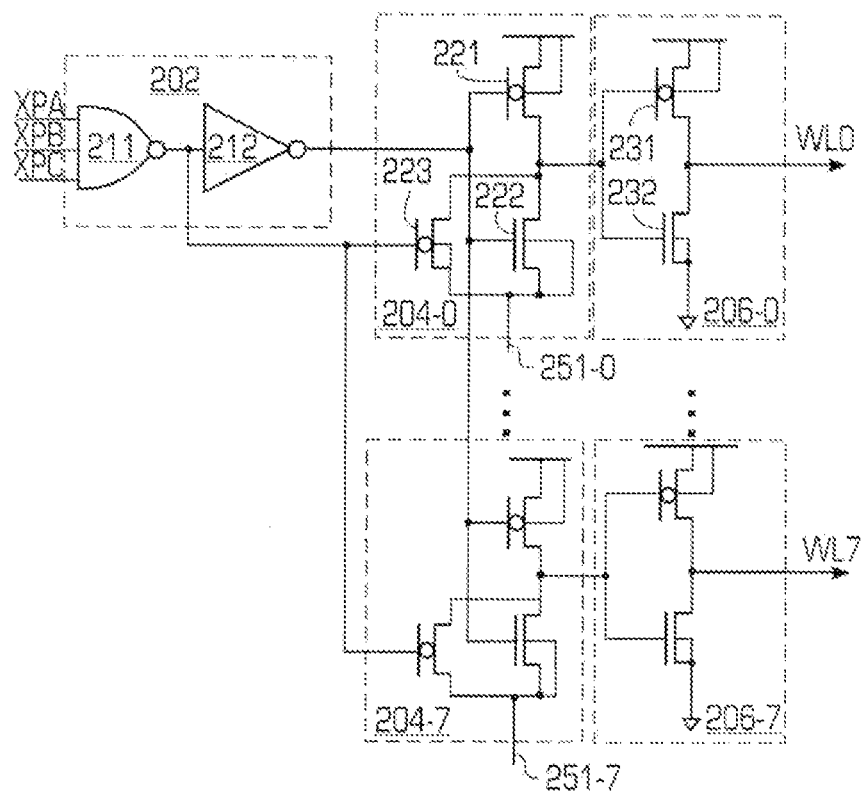
FIG. 2 is a schematic diagram illustrating an embodiment of an x-decoder of the digital multilevel bit memory system of FIG. 1B.

FIG. 2 is a schematic diagram illustrating one embodiment of the x-decoder 120 of the multilevel bit memory system 100. The x-decoder 120 comprises a pre-decoder 202, a plurality of decoders 204-0 through 204-7, and a plurality of word line drivers 206-0 through 206-7. As an exemplary embodiment, eight decoders 204 and eight word line drivers 206 are shown; however, any number of decoders 204 and word line drivers 206 may be used. The pre-decoder 202 decodes a plurality of address signals, such as address signals XPA, XPB and XPC, for enabling selected ones of the decoders 204. In one embodiment, the pre-decoder 202 comprises a NAND gate 211 and an inverter 212. The decoders 204 provide an enable signal to a corresponding word line driver 206 in response to an enable signal from the pre-decoder 202 and a corresponding bit line select signal 251-0 through 251-7. In one embodiment, the decoder 204 comprises PMOS transistors 221 and 223 and an NMOS transistor 222. (For clarity, only decoder 204-0 shows the reference numerals of the transistors therein.) The plurality of word line drivers 206-0 through 206-7 provides a drive signal on a word line WL0 through WL7, respectively. In one embodiment, the word line driver 206 comprises a PMOS transistor 231 and an NMOS transistor 232. (For clarity, only word line driver 206-0 shows the reference numerals of the transistors.)

The bulks of the PMOS transistors 221, 223 and 231 are coupled to the supply voltage VDD. The bulks of the NMOS transistors 222 and 232 are coupled to ground.

FIG. 3 is a schematic diagram illustrating another embodiment of the x-decoder 120 multilevel bit memory system 100. The x-decoder 120 comprises a pre-decoder 302, a plurality of decoders 304-0 through 304-7, and a plurality of word line drivers 306-0 through 306-7. The pre-decoder 302 decodes a plurality of address signals, such as address signals XPA, XPB and XPC for enabling selected ones of the decoders 304. In one embodiment, the pre-decoder 302 comprises a NAND gate 311 and an inverter 312. The decoders 304 provide an enable signal to a corresponding word line driver 306 in response to an enable signal from the pre-decoder 302 and a corresponding bit line select signal 351-0 through 351-7. In one embodiment, the decoder 304 comprises PMOS transistors 321 and 323 and an NMOS transistor 322. (For clarity, only decoder 304-0 shows the reference numerals of the transistors.) The plurality of word line drivers 306-0 through 306-7 provides a drive signal on a word line WL0 through WL7, respectively. In one embodiment, the word line driver 306 comprises a PMOS transistor 331 and an NMOS transistor 332. (For clarity, only word line driver 306-0 shows the reference numerals of the transistors.)

The PMOS transistors 321, 323, and 331 include bulk voltage terminals 361, 363, and 371, respectively, for coupling to a power source that supplies corresponding bulk voltages that may be different from the supply voltage Vdd. The power source may be selected from the voltage generators 400, 800, 900, and 1000, which are described below in conjunction with FIGS. 4, 8, 9, and 10, respectively. The bulk voltage terminal 361, 363, and 371 may receive voltages that are different from each other, the same, or combinations thereof. The bulk voltage applied to the bulk voltage terminals 361, 363, 371 may be set at a level to bias the pn junctions in the PMOS transistors to set the operating current and voltage of the pn junction at a level above or below the junction voltage. In a similar manner, the NMOS transistors 322 and 332 include bulk voltage terminals 362 and 372, respectively, for coupling to a voltage supply that may be different than ground. The bulk voltage terminals 322 and 332 may receive voltages that are different from each other, the same, or combinations thereof. In one embodiment, the bulk voltages are set at a voltage level other than the supply voltage Vdd or ground only for the transistors in the selected decoder 304 and corresponding word line driver 306. The selective setting of bulk voltages provides tracking bias body driving of the transistors in the selected decoder 304 and corresponding word line driver 306. The selective setting of bulk voltages is done individually for one wordline driver 306, for example for selected wordline driver 306-0, or for all 8 wordline drivers 306-0 to 306-7 (i.e., one sector is selected, and one sector includes all 8 wordlines) even though only one out of 8 wordline drivers 306 in a sector is selected, The selective setting of bulk voltages reduces power consumption of the system 100 in view of providing the bulk voltages to all decoders 304 and word line drivers 306. The tracking bias also reduces noise and reduces likelihood of latch up. The selective setting of bulk voltages can be done automatically by the circuit that uses a bulk voltage for self optimization (to be called self conscious circuitry). Thus, circuit selects its own bulk voltage, for example either less than the pn forward junction voltage for a goal of less noises, or slightly larger than the pn forward junction voltage for a goal of maximum speed.

Figure 4:
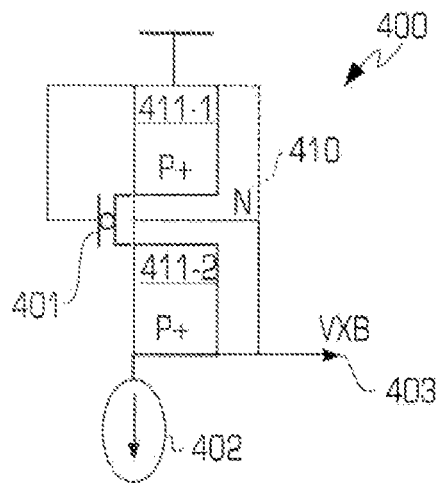
FIG. 4 is a schematic diagram illustrating a voltage generator for generating a forward junction current defined bias.

FIG. 4 is a schematic diagram illustrating a voltage generator 400 for generating a forward junction current defined bias for the bulk voltage. The voltage generator 400 may be part of the V&I-GEN 175 (FIG. 1A). The voltage generator 400 comprises a reverse diode-connected PMOS transistor 401 coupled between a supply voltage Vdd and a bias voltage terminal 403, and further comprises a current source 402 coupled between the drain of the PMOS transistor 401 and ground. The bias voltage terminal 403 is coupled to the drain of the PMOS transistor 401. The gate of the PMOS transistor 401 is coupled to the supply voltage Vdd. The source of the PMOS transistor 401 is coupled to the supply voltage Vdd. The bulk of the PMOS transistor 401 is coupled to the bias voltage terminal 403. By way of illustration, the physical layout of the PMOS transistor 401 is shown with an n-well 410 and p-regions 411-1 and 411-2, which may form a source and drain. The current source 402 flows through the terminal 403, through the bulk of the PMOS transistor 401 and into the source of the PMOS transistor 401. The source of the PMOS transistor 401 and the bulk of the PMOS transistor 401 constitute a pn junction, through which the current from the current source 402 flows. In one embodiment the physical effect tracking is done by using the PMOS 401 as an exact replica to the PMOS transistors to which the bulk voltage is provided. This is similarly done for other tracking bias generators, such as the generators of FIGS. 7 and 11.

Figure 5:
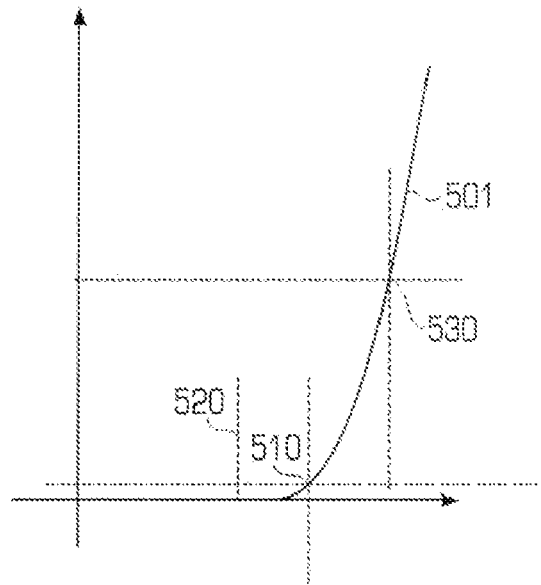
FIG. 5 is a graph illustrating the voltage-current characteristics of a pn junction with defined operating points for bias voltages of a PMOS transistor.

FIG. 5 is a graph illustrating the voltage-current characteristics of a pn junction as indicated by a line 501 with defined operating points for bias voltages of a PMOS transistor. The voltage generator 400 operates at an operating point 510 that is above the threshold voltage (VDIO) of the pn junction formed by the p-regions 411 and the n-well 410. The operating point 510 is selected at a level to avoid noise and potential latch-up that occurs at higher voltages and currents. At high current, substantial substrate current may be injected into the substrate and could potentially turn on a parasitic PNP transistor formed of a source junction of the PMOS (P+ source), a bulk of the PMOS (N from N-well) and silicon substrate P-sub. This in turn potentially turns on an adjacent parasitic NPN transistor formed of a N+ drain/source of an adjacent NMOS transistor, the silicon substrate P-sub, and the N-well of the PMOS transistor. These two bipolar transistors are coupled in a positive feedback action which may cause a latch-up condition to happen, and thus a very high current is introduced by these two bipolar devices and it could cause destructive device failure. Noise is induced by the injected substrate current since this current could be picked up inadvertently. Also this current could modulate the substrate potential locally.

Figure 6:
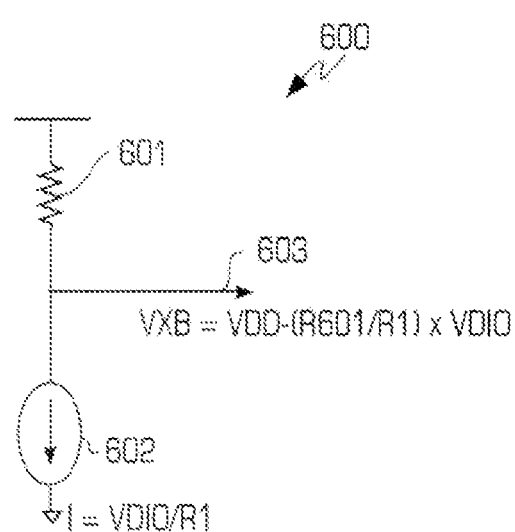
FIG. 6 is a schematic diagram illustrating a voltage generator for generating a tracking under bias voltage.

FIG. 6 is a schematic diagram illustrating a voltage generator 600 for generating a tracking under bias voltage. The voltage generator 600 may be part of the V&I-GEN 175 (FIG. 1A). The voltage generator comprises a resistor 601 and a current generator 602 coupled in series between a supply voltage Vdd and ground and forming a common node between the resistor 601 (having a resistance R601) and the current generator 602 that is coupled to a bulk voltage terminal 603. The voltage generator 600 generates a bulk voltage VXB applied to the bulk voltage terminal 603 that operates at an operating point 520 (FIG. 5). The voltage dVXB (voltage across the resistor 601 (R601)) is generated based on a ratio of resistances (R1 and R601) of resistor 601 and a reference resistor R1, such as a resistor 709 in FIG. 7. In one embodiment, the voltage dVXB is set at 0.8 of the pn junction voltage VDIO. The voltage generator 600 operates at the operating 520 that has less noise than the operating point 510 but has less than an optimal tracking bias.

Figure 7:
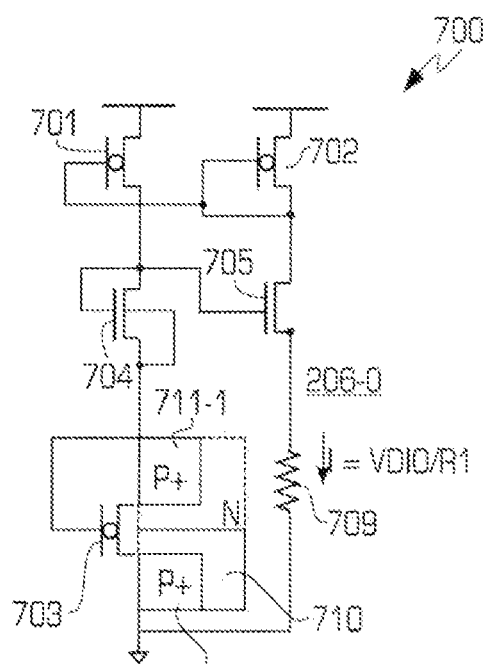
FIG. 7 is a schematic diagram illustrating a current generator as one embodiment of the current generator of FIG. 6.

FIG. 7 is a schematic diagram illustrating a current generator 700, which may be one embodiment of the current generator 602. The current generator 700 comprises a plurality of PMOS transistors 701, 702 and 703, a plurality of NMOS transistors 704 and 705, and a resistor 709 (having a resistance R1). The transistors 701, 703, and 704 are arranged to provide a current that is mirrored through the resistor 709 from the current mirror formed of the transistors 702 and 701 and current mirror of the transistor 704 and 705. The current through the resistor 709 equals the diode voltage VDIO divided by the resistance of the resistor 709, or I=VDIO/R1. By way of illustration, the physical layout of the PMOS transistor 703 is shown with an n-well 710 and p-regions 711-1 and 711-2, which may form a source and drain.

Figures 8, 9:
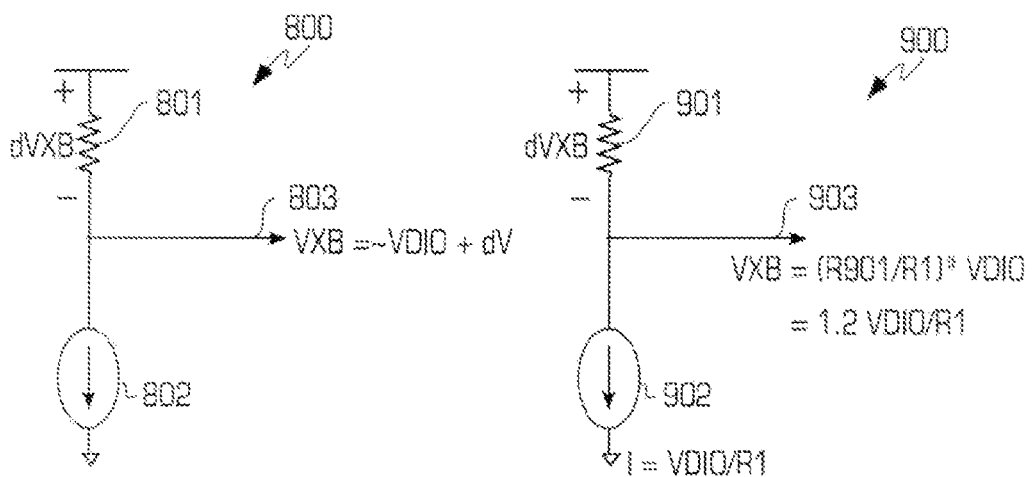
FIG. 8 is a schematic diagram illustrating a voltage generator for generating a tracking over bias voltage.
FIG. 9 is a schematic diagram illustrating a voltage generator for generating a tracking over bias voltage based on the diode voltage.

FIG. 8 is a schematic diagram illustrating a voltage generator 800 for generating a tracking over bias voltage VXB. The voltage generator 800 may be part of the V&I-GEN 175 (FIG. 1A). The voltage generator 800 comprises an over-biasing resistor 801 and a current source 802 that is coupled in series between a supply voltage Vdd and ground and forming a common node between the resistor 801 and the current source 802 that is coupled to a bulk voltage terminal 803. The current of the current source 802 is selected to provide a tracking bias voltage approximately equal to the pn junction voltage plus a difference voltage (dV) to set an operating point between the operating point 510 and an operating point 530 (FIG. 5).

FIG. 9 is a schematic diagram illustrating a voltage generator 900 for generating a tracking over bias voltage based on the diode voltage. The voltage generator 900 may be part of the V&I-GEN 175 (FIG. 1A). The voltage generator 900 comprises a resistor 901 (having a resistance R901) and a current source 902 arranged in a similar manner as the resistor 801 and current source 802 (FIG. 8) to form a bulk voltage terminal 903 that provides a tracking bias bulk voltage based on a ratio of the pn junction voltage VDIO. The current of the current source 902 is selected as a current that is the ratio of the pn junction voltage VDIO and resistance of a resistor R1. The voltage dVXB is based on a ratio of resistances (R1 and R901) and VDIO. Refer again to FIG. 5, the voltage generator 900 generates a tracking bias bulk voltage to operate at an operating point 530 to set the voltage and current.

Figures 10, 11:
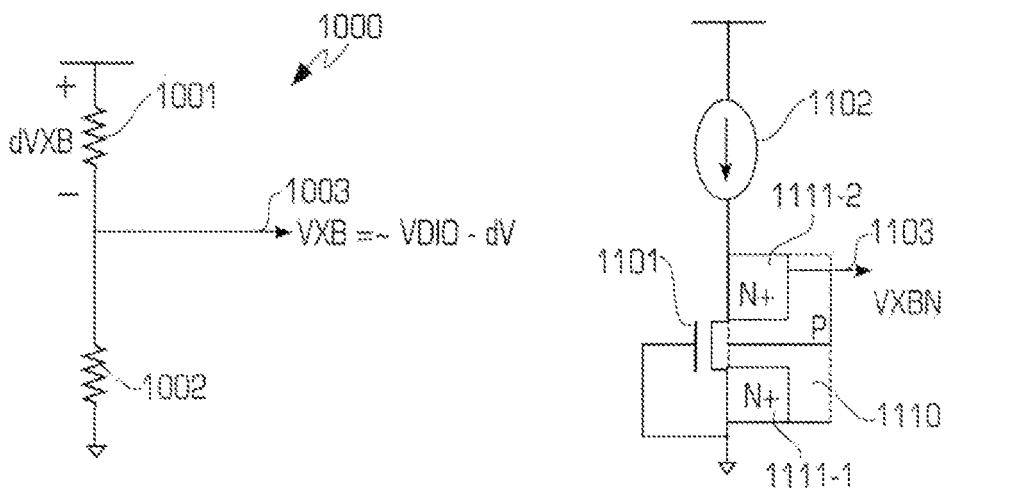
FIG. 10 is a schematic diagram illustrating a voltage generator using a resistor divider to generate the bulk voltage.
FIG. 11 is a voltage generator for generating a forward junction current defined bulk voltage for an NMOS transistor.

FIG. 10 is a schematic diagram illustrating a voltage generator 1000 using a resistor divider to generate the bulk voltage. The voltage generator 1000 may be part of the V&I-GEN 175 (FIG. 1A). The voltage generator 1000 comprises a plurality of resistors 1001 and 1002 coupled in a series between the supply voltage Vdd and ground and form a common node to provide a divided voltage on a bulk voltage terminal 1003. The resistance of the resistors 1001 and 1002 are selected to provide a bias voltage dVXB (VXB=Vdd−dVXB) approximately equal to the pn junction voltage VDIO minus a difference voltage (dV) to set an operating point between the operating point 510 and an operating point 530 (FIG. 5).

FIG. 11 is a voltage generator 1100 for generating a forward junction current defined bulk voltage for an NMOS transistor. The voltage generator 1100 may be part of the V&I-GEN 175 (FIG. 1A). The voltage generator 1100 comprises a current source 1102 coupled between a supply voltage Vdd and a bias voltage terminal 1103, and further comprises a diode connected NMOS transistor 1101 coupled between the bias voltage terminal 1102 and ground. The bulk of the NMOS transistor 1101 is coupled to the bias voltage terminal 1103. By way of illustration, the physical layout of the NMOS transistor 1101 is shown with a p-well 1110 and n-regions 1111-1 and 1111-2, which may form a source and drain.

Figure 12:
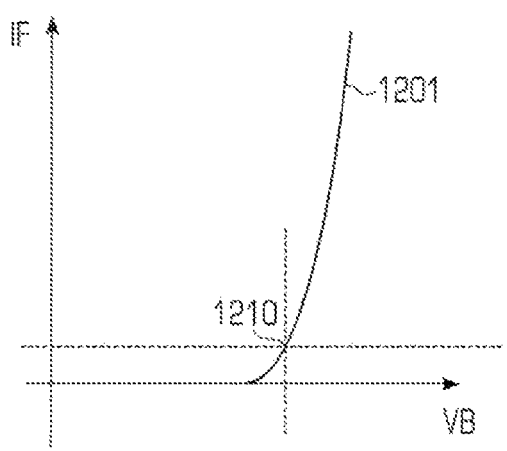
FIG. 12 is a graph illustrating the voltage-current characteristics of a pn junction with defined operating points for bias voltages of an NMOS transistor.

FIG. 12 is a graph illustrating the voltage-current characteristics of a pn junction as indicated by a line 1201 with a defined operating point for bias voltages of the NMOS transistor 1101. The voltage generator 1100 operates at an operating point 1210 that is above the threshold voltage (VDIO) of the pn junction formed by the n-regions 1111 and the p-well 1110. The operating point 1210 is selected at a level to avoid noise and potential latch-up that occurs at higher voltages and currents.

Figure 3A:
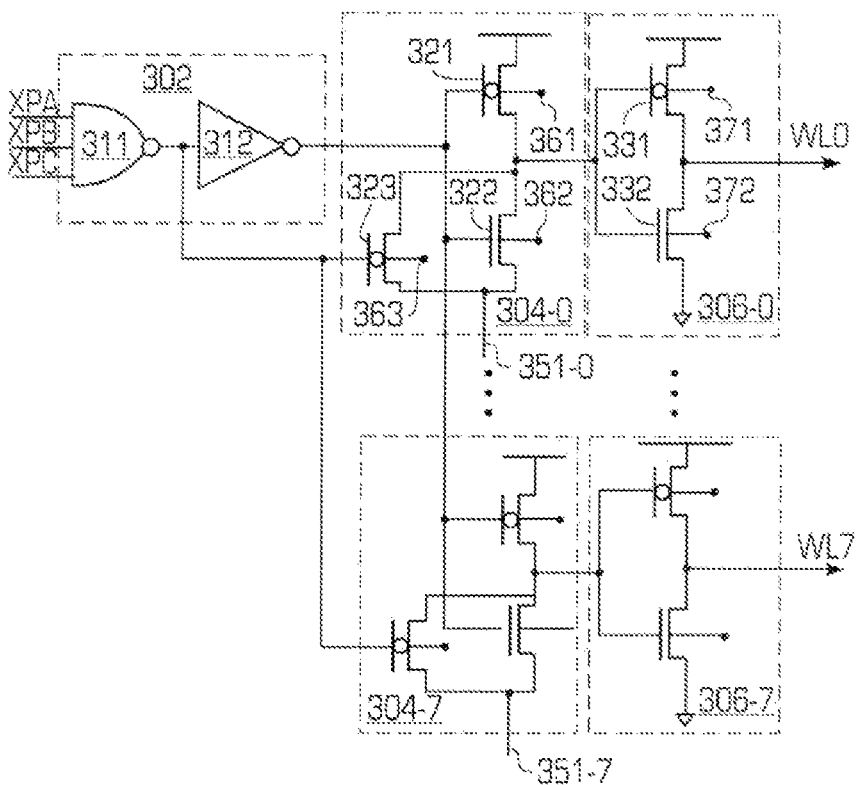
FIG. 3A is a schematic diagram illustrating an embodiment of the x-decoder of the digital multilevel bit memory system of FIG. 1B.
Figure 3B:
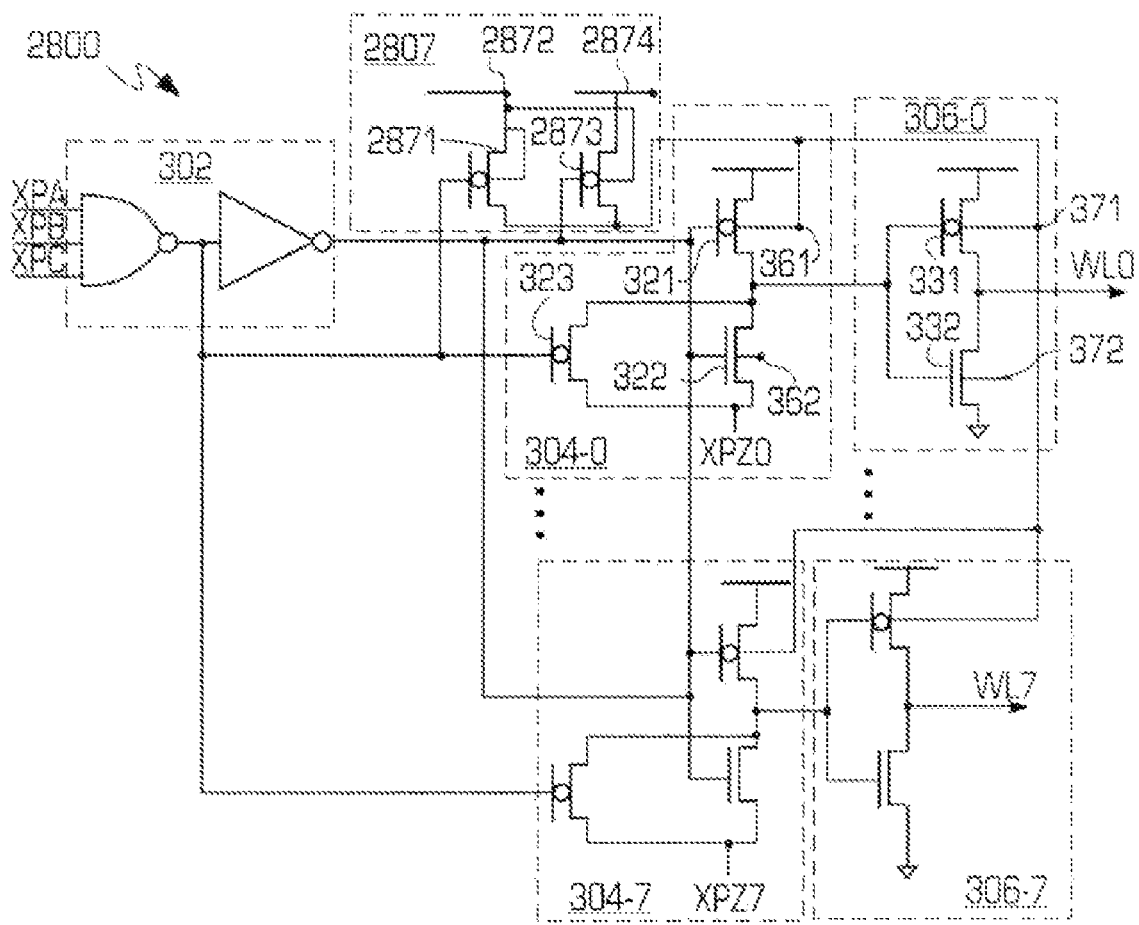
FIG. 3B is a schematic diagram illustrating an embodiment of the x-decoder of the digital multilevel bit memory system of FIG. 1B.

FIG. 3B is a schematic diagram illustrating an x-decoder 2800, which is one embodiment of the x-decoder 120. The x-decoder 2800 comprises a pre-decoder 302, a plurality of decoders 304-0 through 304-7, and a plurality of word line drivers 306-0 through 306-7 arranged in a similar manner as the x-decoder of FIG. 3A. The x-decoder 2800 further comprises a bulk voltage generator 2807 for providing a bulk voltage on the bulk voltage terminals 361 of the decoders 304 and on the bulk voltage terminals 371 of the word line drivers 306. The bulk voltage generator 2807 comprises a plurality of PMOS transistors 2871 and 2873. The PMOS transistor 2871 is coupled between a voltage node 2872 and a common node formed of the drain of the transistor 2871 and drain of the PMOS transistor 2873. This common node is coupled to the bulk voltage terminals 361 and 371. The bulk of the PMOS transistors 2871 and 2873 are coupled to a voltage node 2874. The gate of the PMOS transistor 2871 is enabled by an enable signal from the predecoder 302 (output of the NAND gate 311 of the predecoder 302). The gate of the PMOS transistor 2873 is enabled by an enable signal from the predecoder 302 (output of the inverter 312 of the predecoder 302) When enabled, the PMOS transistor 2871 pulls up the voltage on the bulk voltage terminals 361 and 371 to the voltage on the voltage node 2872, which may be, for example, the supply voltage Vdd. When the PMOS transistor 2871 is disabled, the PMOS transistor 2873 pulls up the voltage on the bulk voltage terminals 361 and 371 to the voltage (which may be the same, higher or lower than VDD) on the voltage node 2874, which may be, controlled to reverse or forward bias pn junctions of the PMOS transistors 321 and 331. In the case that the voltage on the voltage node 2874 is higher than the supply voltage Vdd, the bulks of the transistor 2871 and 2873 may be re-connected or switched by a multiplexer (not shown) to the node 2874.

Figure 3C:
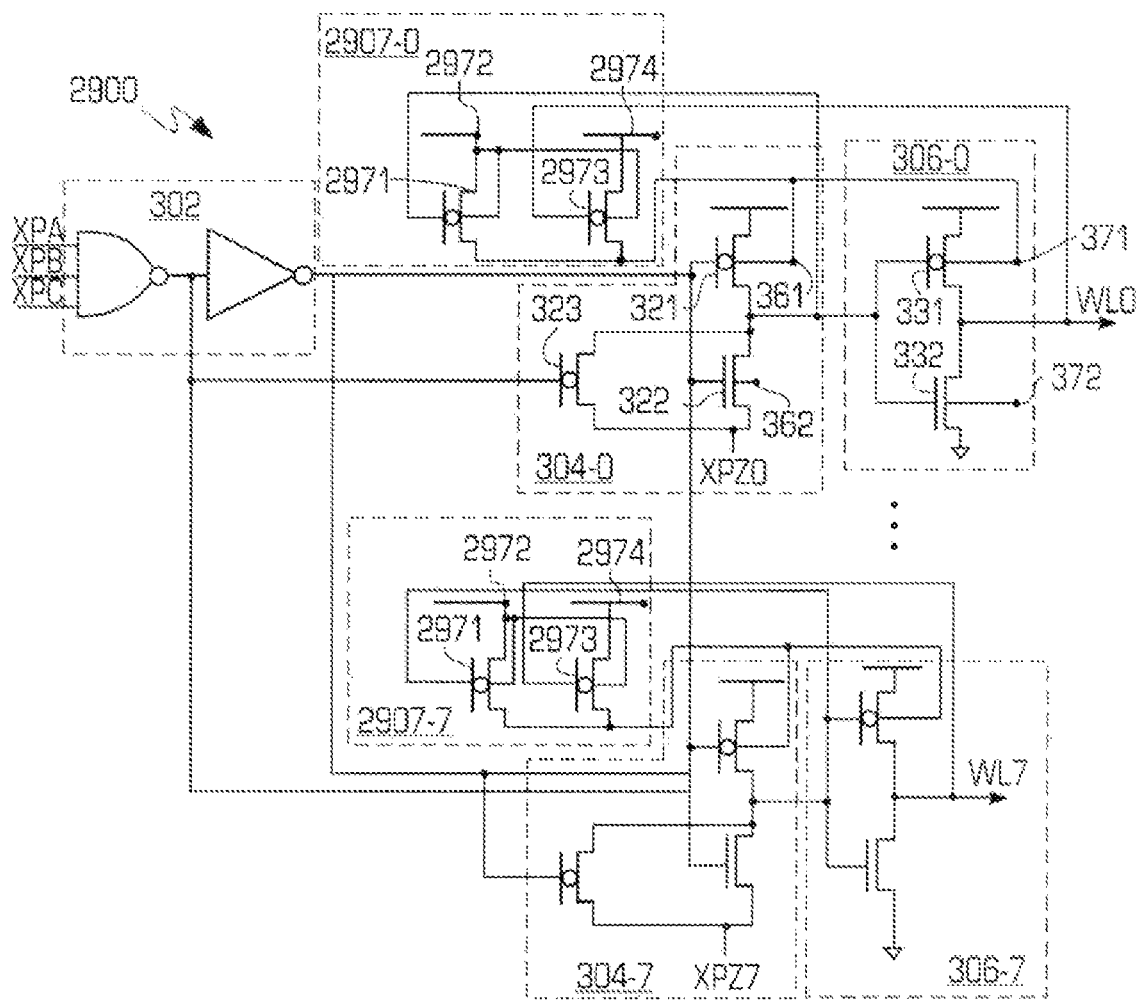
FIG. 3C is a schematic diagram illustrating an embodiment of the x-decoder of the digital multilevel bit memory system of FIG. 1B.

FIG. 3C is a schematic diagram illustrating an embodiment of the x-decoder 2900, which is one embodiment of the x-decoder 120. The x-decoder 2900 comprises a pre-decoder 302, a plurality of decoders 304-0 through 304-7, and a plurality of word line drivers 306-0 through 306-7 arranged in a similar manner as the x-decoder of FIG. 3A. The x-decoder 2900 further comprises a plurality of bulk voltage generators 2907-0 through 2907-7 for providing a bulk voltage on the bulk voltage terminals 361 of the respective decoders 304-0 through 304-7 and on the bulk voltage terminals 371 of the respective word line drivers 306-0 through 306-7. The bulk voltage generator 2907 comprises a plurality of PMOS transistors 2971 and 2973. The PMOS transistor 2971 is coupled between a voltage node 2972 and a common node formed of the drains of the PMOS transistor 2973 and the PMOS transistor 2971 and the bulk voltage terminals 361 and 371. The bulk of the PMOS transistors 2971 and 2973 are coupled to a voltage node 2972. The gate of the PMOS transistor 2971 is enabled by an enable signal from the drain of the transistor 321. When enabled, the PMOS transistor 2971 pulls up the voltage on the bulk voltage terminals 361 and 371 to the voltage on the voltage node 2972, which may be, for example, the supply voltage Vdd. When the PMOS transistor 2971 is disabled, and the PMOS transistor 2973 is enabled by the output of the word line driver 306, the PMOS transistor 2973 pulls up the voltage (which may be the same, higher or lower than VDD) on the bulk voltage terminals 361 and 371 to the voltage on the voltage node 2974, which may be, controlled to reverse or forward bias pn junctions of the PMOS transistors 321 and 331. In the case that the voltage on the voltage node 2974 is higher than the supply voltage Vdd, the bulks of the transistor 2971 and 2973 may be re-connected or switched by a multiplexer (not shown) to the node 2974.

Figure 3D:
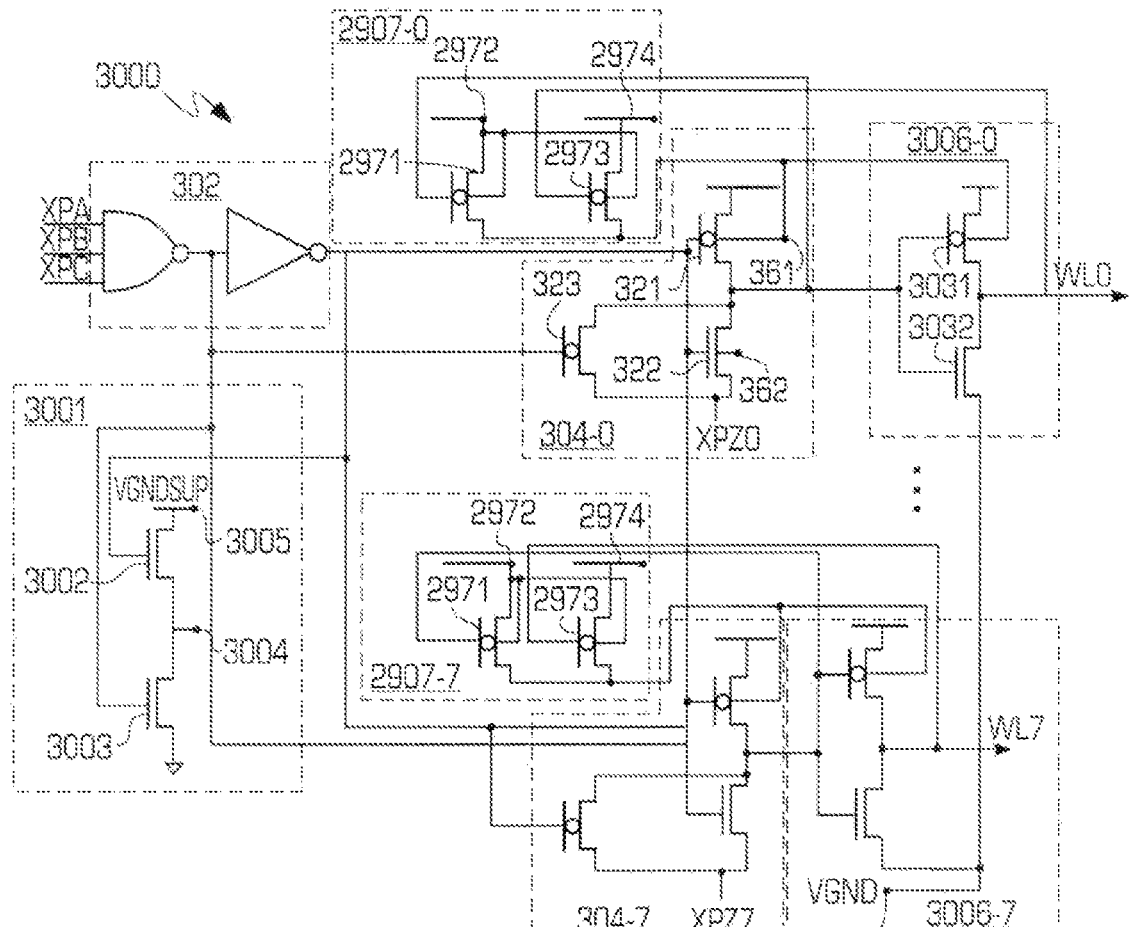
FIG. 3D is a schematic diagram illustrating an embodiment of the x-decoder of the digital multilevel bit memory system of FIG. 1B.

FIG. 3D is a schematic diagram illustrating an x-decoder 3000, which is one embodiment of the x-decoder 120. The x-decoder 3000 comprises a pre-decoder 302, a plurality of decoders 304-0 through 304-7, and a plurality of bulk voltage generators 2907-0 through 2907-7 arranged in a similar manner as the x-decoder 2900 of FIG. 3C. The x-decoder 3000 further comprises a plurality of word line drivers 3006-0 through 3006-7 that provide a drive signal on a word line WL0 through WL7, respectively. In one embodiment, the word line driver 306 comprises a PMOS transistor 3031 and an NMOS transistor 3032. (For clarity, only word line driver 3006-0 shows the reference numerals of the transistors.) The sources of the NMOS transistors 3032 are coupled to a virtual ground (VGND) terminal 3004. The x-decoder 3000 further comprises a virtual ground selection circuit 3001 that selectively couples the virtual ground terminal 3004 to ground or to a virtual negative voltage (VGNDSUP) terminal 3005. The virtual ground selection circuit 3001 comprises a plurality of NMOS transistors 3002 and 3003 coupled in series between the virtual negative voltage (VGNDSUP) terminal 3005 and ground. The NMOS transistors 3002 and 3003 are enabled by the output of the NAND gate 311 and the inverter 312, respectively, to pull up or pull down the voltage on the terminal 3304 to either a virtual negative voltage or ground, respectively.

The virtual ground level (vGND) is a negative level, e.g., $-0.6$ to $-0.05$V, to deselect the unselected wordlines locally and selectively, for example deselecting 7 unselected wordlines out of 8 wordlines in a sector. This is to avoid the neighboring cells from interfering with the operation of the selected cell such as reducing the adjacent leakage in programming in a sector. Or reducing the operation of the selected cell from interfering the unselected cell such as the program disturb. The virtual ground level (vGND) value may be chosen to avoid forward biasing the Psub/N+ source/drain regions of an NMOS transistor in a Psub CMOS process, hence chosen as an underbias ratio $\alpha$ of the pn junction voltage VDIO.

For example=$-\alpha*$VDIO=$-0.5*0.6$=$-0.3$V

The negative level is for example generated by switching a predetermined-value capacitor (not shown) from a high bias level to a low bias level and the capacitor being coupled to the terminal (vGNDSUP) 3005. In one embodiment, the vGND negative level can be used to locally and selectively deselect the bitline decoders (Y-muxing) to reduce the leakage current on the selected bitline.

Figure 3E:
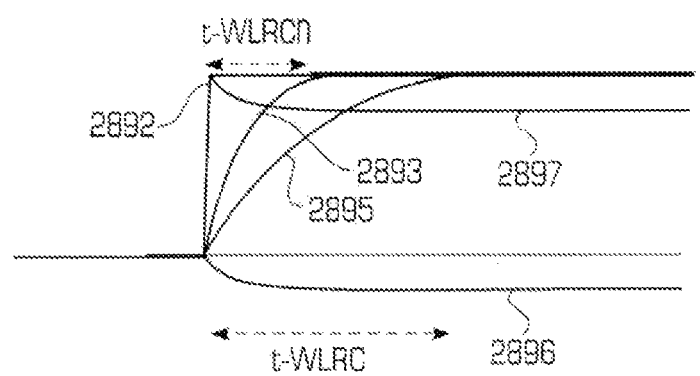
FIG. 3E is a timing diagram showing waveforms of the x-decoder of FIG. 3D.

FIG. 3E is a timing diagram showing waveforms of the x-decoder 3000. A waveform 2892 is the ideal voltage on the word line during a transition. A waveform 2895 is the voltage on the word line with 'normal' RC behavior with a rise time (t-WLRC) from the RC time constant of the word line. A waveform 2893 is the voltage on the word line with selective bulk decoding. The waveform 2893 has a rise time (t-WLRCn) from the selective decoding of enabling one decoder and providing a virtual ground level, shown as waveform 2896. Waveforms 2896 and 2897 are the voltages of the virtual ground (vGND) and the bulk voltage (VXB), respectively.

Figure 13:
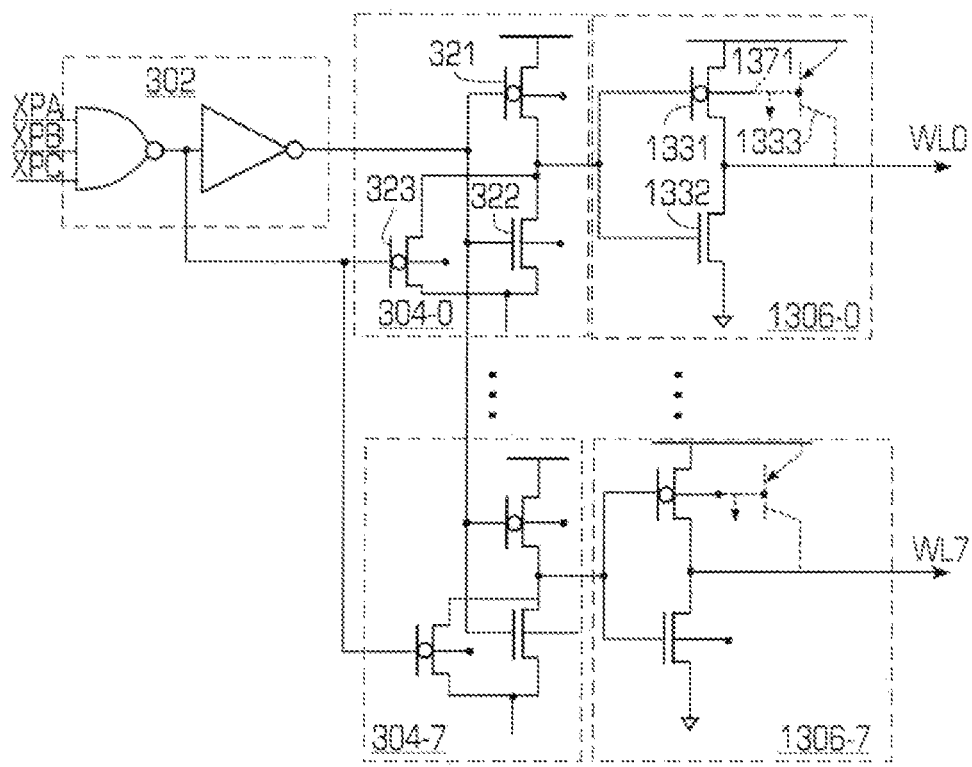
FIG. 13 is a schematic diagram illustrating an x-decoder for driving the bulk with bipolar action.

FIG. 13 is a schematic diagram illustrating an x-decoder 120 for driving the bulk with bipolar action in parallel with the MOS transistor action. The x-decoder 120 comprises a pre-decoder 302, a plurality of decoders 304, and a plurality of word line drivers 1306. The pre-decoder 302 and the decoders 304 are described above in conjunction with FIG. 3. The word line driver 1306 comprises a PMOS transistor 1331 and a NMOS transistor 1332 arranged in a similar manner as the respective PMOS transistor 331 and NMOS transistor 332 of the word line driver 306 (FIG. 3). (For clarity, only word line driver 1306-0 shows the reference numerals of the transistors.) The word line driver 1306 further comprises an effective PNP transistor 1333 formed by parasitic bipolar action in the p and n regions of the PMOS transistor 1331 on a bulk voltage terminal 1371. The bipolar effect may occur effectively as dimensions of the PMOS transistor 1331 are small relative to the depletion regions that form as a PNP transistor. In effect the PNP is a lateral PNP with the base region defined by the channel length of the PMOS that acts effectively with fast base transit time across the small base region. As the dimensions of the PMOS transistor 1331 decrease, the PMOS transistor 1331 operates as if it includes an effective lateral PNP transistor 1333 coupled thereto in parallel. In one embodiment, the decoder 304 includes bipolar action.

Figure 14:
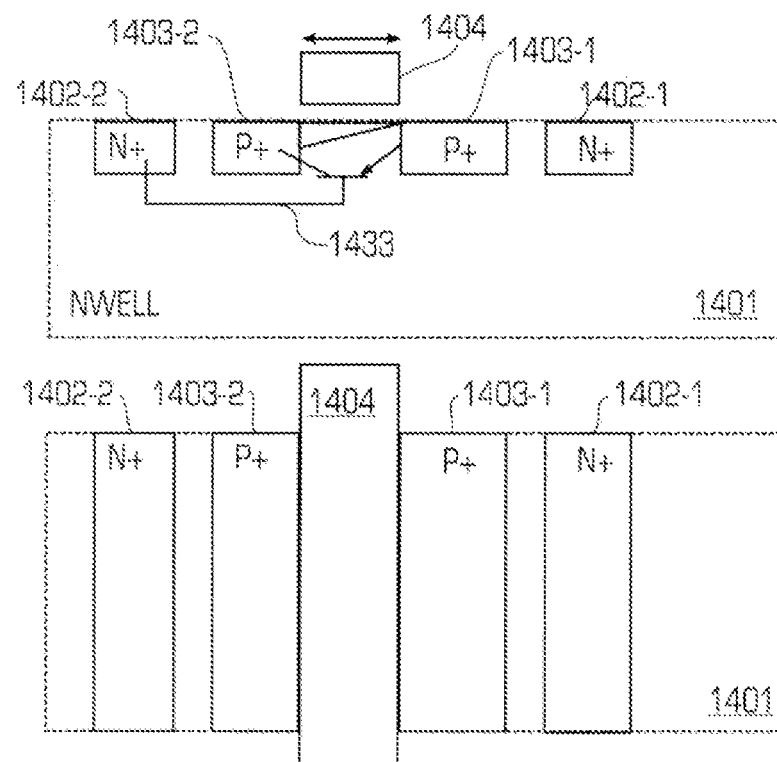
FIG. 14 is a side view and a top plan view of an illustrative transistor illustrating the parasitic bipolar action of the x-decoder of FIG. 13.

FIG. 14 is a side view and a top plan view of an illustrative transistor illustrating the parasitic bipolar action of the word line driver 1306. The transistor comprises an n well 1401, a plurality of n doped regions 1402-1 and 1402-2, a plurality of p doped regions 1403-1 and 1403-2, and a gate 1404. A PNP transistor 1433 is shown including a collector coupled to the p doped regions 1403-2, an emitter coupled to the p doped region 1403-1, and a base coupled to the n doped region 1402-2. The p doped regions 1403-1 and 1403-2 and the gate 1404 have rectangular shapes.

Figure 15:
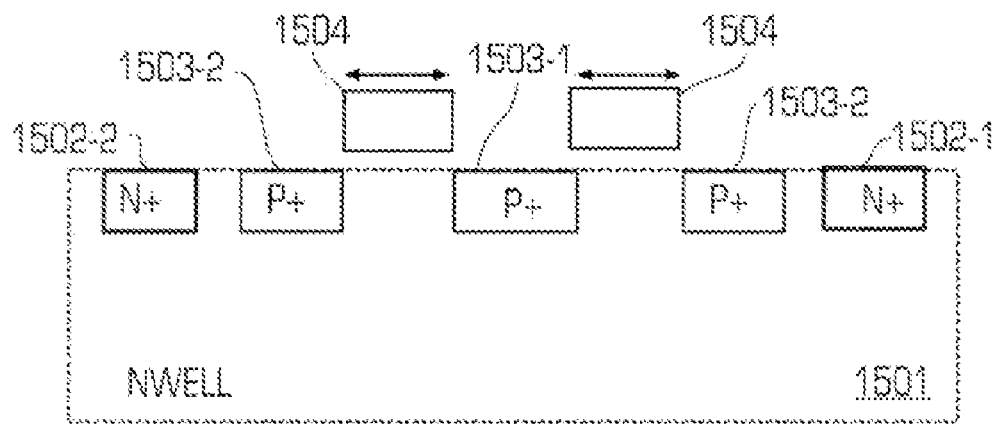
FIG. 15 is a side view and top plane view of a layout of a transistor of the x-decoder of FIG. 13.
Figure 15:
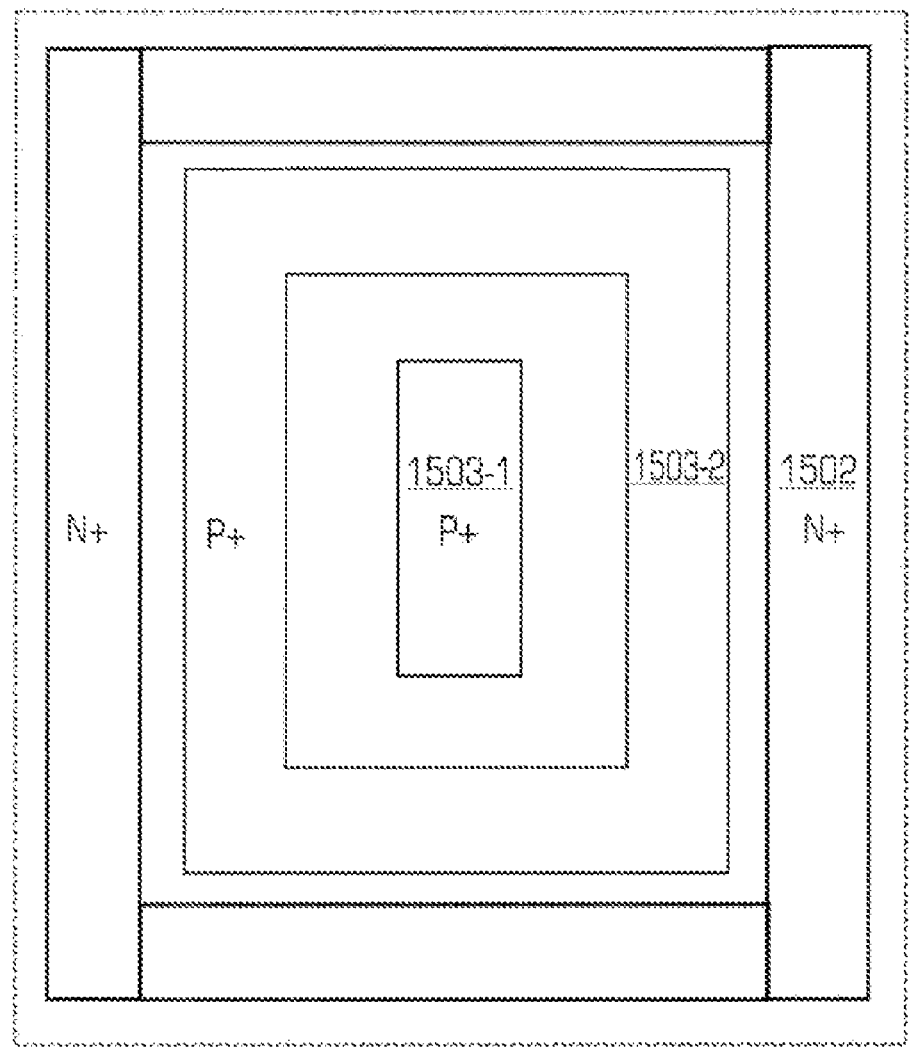

FIG. 15 is a side view and top plan view of a layout of a transistor in the word line decoders 1306. The transistor comprises an n well 1501, a plurality of n doped regions 1502-1 and 1502-2, a plurality of p doped regions 1503-1 and 1503-2, and a plurality of gates 1504. The p doped region 1503-1 is rectangular. The p doped region 1503-2 has a rectangularized annular shape. Since for the parasitic lateral PNP, the collector region (p doped region 1503-2) now is extended to completely surround the whole emitter region (p doped region 1503-1), the PNP is more effective.

FIG. 16 is a schematic diagram illustrating an x-decoder 1600 with level shifting. In one embodiment, the x-decoder 1600 is used for circuits having a limited current supply from an on-chip word line charge pump. The x-decoder 1600 comprises a level shift circuit 1602 and a drive circuit 1606. The level shift circuit 1602 shifts the voltage above the supply voltage Vdd to another level, for example, a higher voltage VPWL on a line 1609, to provide a decode signal 1608 operating at a higher voltage than the supply voltage Vdd. The level shift circuit 1602 comprises a plurality of PMOS transistors 1610 and 1611, a plurality of NMOS transistors 1612 and 1613, and a plurality of inverters 1614 and 1615. The transistors 1610, 1611, 1612 and 1613 are cross-coupled and selectively controlled by the NMOS transistors 1612 and 1613 in response to a control signal 1617 applied through the inverter 1614 and 1615, respectively. The drive circuit 1606 comprises a PMOS transistor 1631 and an NMOS transistor 1632. The bulk of the PMOS transistor 1631 is coupled to a bulk voltage terminal 1603 for receiving a selective bulk voltage, such as described above in conjunction with FIGS. 3-15. In one embodiment, the x-decoder 1600 includes bipolar action on the PMOS transistors.

FIG. 17 is a schematic diagram illustrating a voltage generator 1700 for generating a bulk bias with limited current for the bulk voltage terminal 1603. The voltage generator 1700 may be part of the V&I-GEN 175 (FIG. 1A). The voltage generator 1700 comprises a plurality of PMOS transistors 1701 and 1702, a plurality of current sources 1703 and 1704, and a resistor 1705. The resistor 1705, the PMOS transistor 1701, and the current source 1703 are coupled in series to control a current that is mirrored in the PMOS transistor 1702 with the current source 1704. The PMOS transistor 1702 includes a source coupled to a bulk voltage terminal 1707 to provide the bias voltage of the level shift on the bulk voltage terminal 1603 (FIG. 16).

FIG. 18 is a schematic diagram illustrating a voltage generator 1800 for generating a bias voltage using resistor dividers and a capacitor divider. The voltage generator 1800 may be part of the V&I-GEN 175 (FIG. 1A). The voltage generator 1800 comprises a plurality of resistors 1801, 1802, 1803, and 1804, a plurality of capacitors 1805 and 1806, and a switch 1807. The resistors 1801 and 1802 are coupled in series to form a voltage divider, with a divided voltage applied to one terminal of the switch 1807. The resistors 1803 and 1804 are formed as a voltage divider to provide a voltage on a bulk voltage terminal 1808. The capacitors 1805 and 1806 are coupled in series to form a capacitor divider to apply the divided voltage to the bulk voltage terminal 1808. The capacitor divider may provide a faster circuit for higher frequency signals. The switch 1807 is used for sampling at predetermined time intervals the low impedance branch formed of the resistors 1801 and 1802 onto the bulk voltage terminal 1808.

Figure 19:
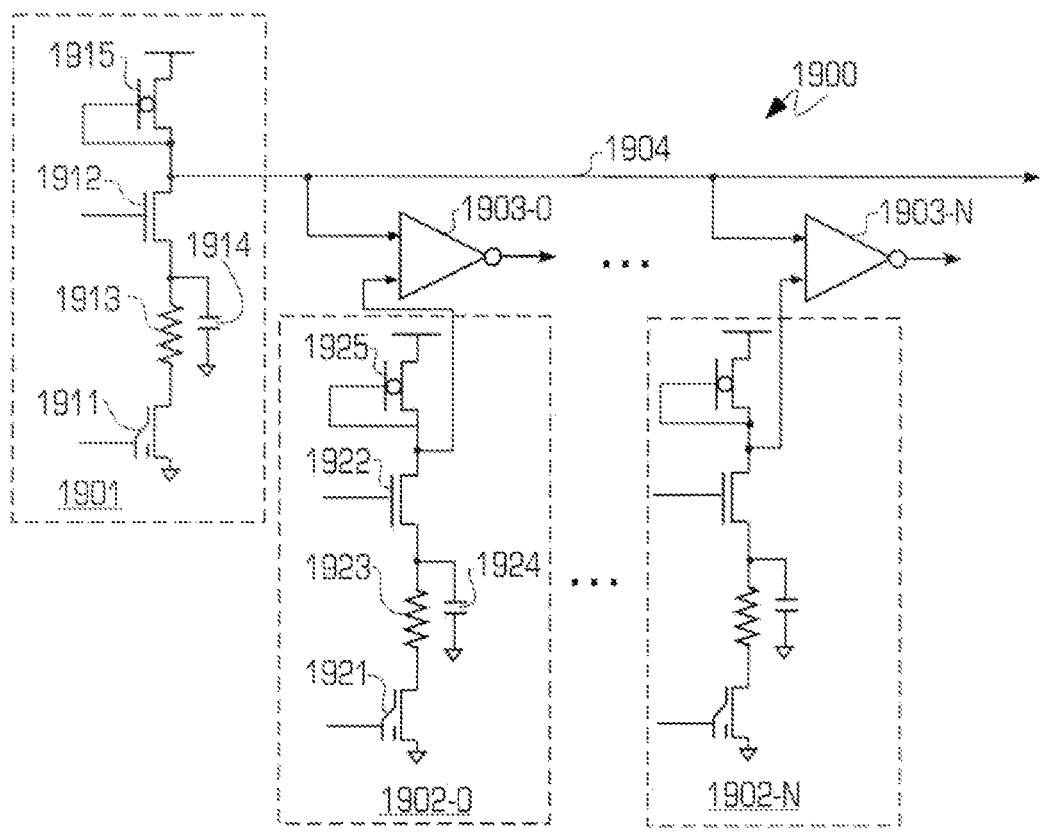
FIG. 19 is a schematic diagram illustrating a sensing system.

FIG. 19 is a schematic diagram illustrating a sensing system 1900. The sensing system 1900 comprises a reference column 1901, a plurality of data columns 1902-0 through 1902-N, and a plurality of comparators 1903-0 through 1903-N. The reference column 1901 comprises a reference memory cell 1911, an NMOS transistor 1912, and a PMOS transistor 1915. A bitline resistor 1913 is shown to indicate resistance on the bitline. A bitline capacitor 1914 is shown to indicate capacitance on the bitline. The reference column 1901 provides a voltage reference on a reference line 1904 which is applied to a first input of each of the comparators 1903-0 through 1903-N. Each data column 1902 comprises a data memory cell 1921, an NMOS transistor 1922 and a PMOS transistor 1925. A bitline resistor 1923 is shown to indicate resistance on the bitline. A bitline capacitor 1924 is shown to indicate capacitance on the bitline. Each of the data columns 1902-0 through 1902-N provides a data output voltage to a second input of a respective comparator 1903-0 through 1903-N so that the comparator 1903 provides an output indicative of the stored data in the corresponding data column 1902. The differential amplifier 1903 may be one of the differential amplifiers of FIGS. 20-23.

Figures 20, 21:
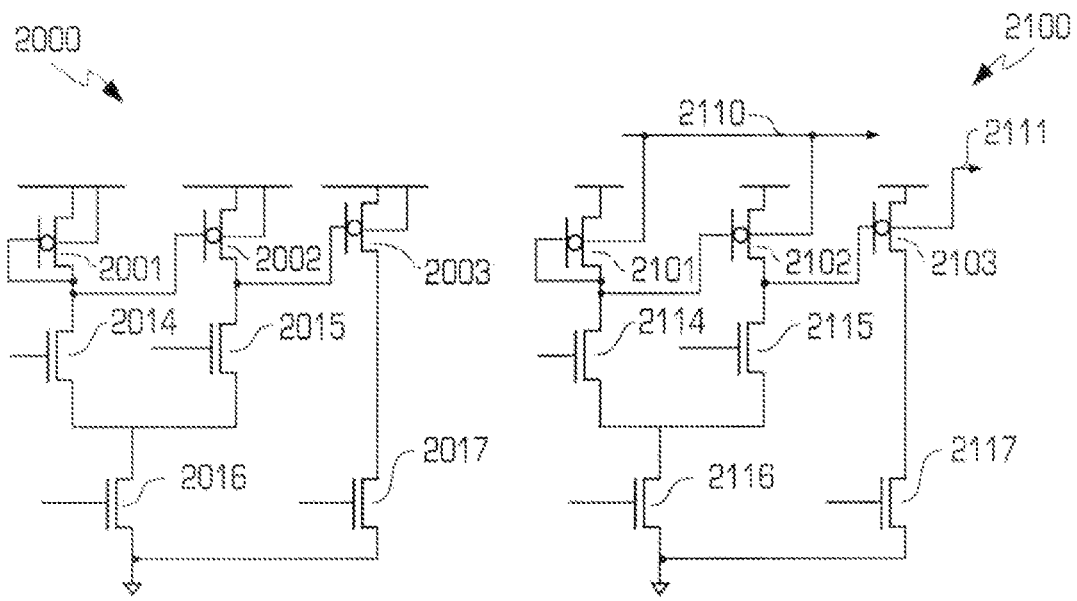
FIG. 20 is a schematic diagram illustrating one embodiment of a differential amplifier of the sensing system of FIG. 19.
FIG. 21 is a schematic diagram illustrating a first embodiment of a differential amplifier of the sensing system of FIG. 19.

FIG. 20 is a schematic diagram illustrating a differential amplifier 2000. The differential amplifier 2000 comprises a plurality of PMOS transistors 2001 and 2002 and a plurality of NMOS transistors 2014, 2015 and 2016 arranged as a differential amplifier with differential pair input terminals coupled to the gates of the NMOS transistors 2014 and 2015. The gate of the NMOS transistor 2016 receives a bias signal. The differential amplifier 2000 further comprises a PMOS transistor 2003 and an NMOS transistor 2017 arranged as an output buffer stage. The gate of the NMOS transistor 2017 receives a bias signal. The bulks of the PMOS transistors 2001, 2002, and 2003 are coupled to the supply voltage Vdd.

FIG. 21 is a schematic diagram illustrating a differential amplifier 2100. The differential amplifier 2100 comprises a plurality of PMOS transistors 2101 and 2102 and a plurality of NMOS transistors 2114, 2115 and 2116 arranged as a differential amplifier with differential pair input terminals coupled to the gates of the NMOS transistors 2114 and 2115. The gate of the NMOS transistor 2116 receives a bias signal. The bulk of the PMOS transistors 2101 and 2102 are coupled to a bulk voltage terminal 2110. The differential amplifier 2100 further comprises a PMOS transistor 2103 and an NMOS transistor 2117 arranged as an output buffer stage. The gate of the NMOS transistor 2117 receives a bias signal. The bulk of the PMOS transistor 2103 is coupled to a bulk voltage terminal 2111. The bulk voltage terminals 2110 and 2111 may receive voltages that are different from each other or the same.

Figure 22:
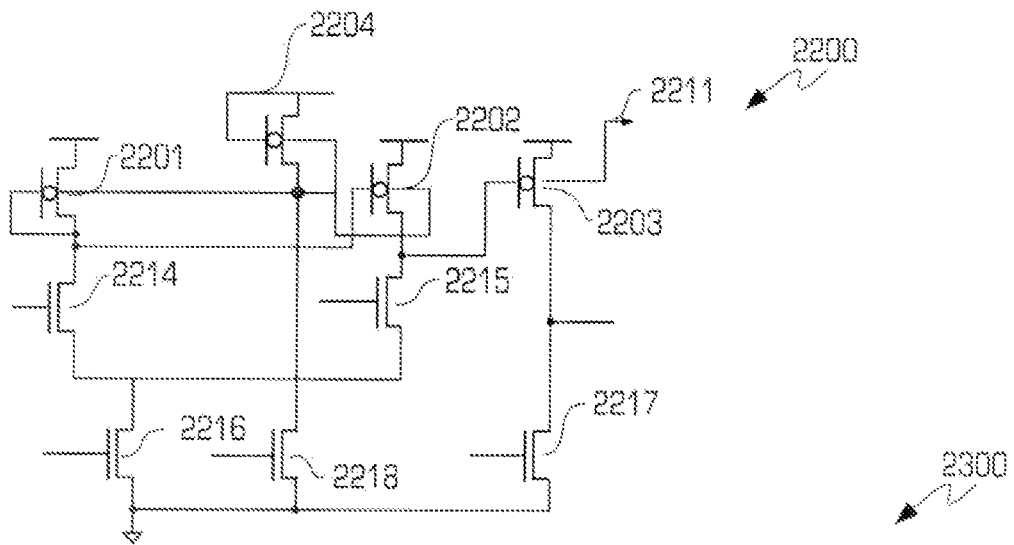
FIG. 22 is a schematic diagram illustrating a second embodiment of a differential amplifier of the sensing system of FIG. 19.

FIG. 22 is a schematic diagram illustrating a differential amplifier 2200. The differential amplifier 2200 comprises a plurality of PMOS transistors 2201 and 2202 and a plurality of NMOS transistors 2214, 2215 and 2216 arranged as a differential amplifier with differential pair input terminals coupled to the gates of the NMOS transistors 2214 and 2215. The gate of the NMOS transistor 2216 receives a bias signal. The differential amplifier 2200 further comprises a PMOS transistor 2203 and an NMOS transistor 2217 arranged as an output buffer stage. The gate of the NMOS transistor 2217 receives a bias signal. The bulk of the PMOS transistor 2203 is coupled to a bulk voltage terminal 2211. The differential amplifier 2200 further comprises a tracking p-region load body bias circuit formed of a reverse diode connected PMOS transistor 2204 and an NMOS transistor 2218, which has a gate that receives a bias signal. The drain of the diode connected PMOS transistor 2204 is coupled to the bulk of the PMOS transistors 2201, 2202, and 2204 to provide local self-tracking biasing of the bulk of the transistors 2201, 2202 and 2204. In one embodiment, the transistor 2204 is an exact replica or substantially exact replica of the transistors 2201 and 2202 in terms of dimension and layout structure. The physical location of the transistor 2204 may be between or close to the transistors 2201 and 2202.

Figure 23:
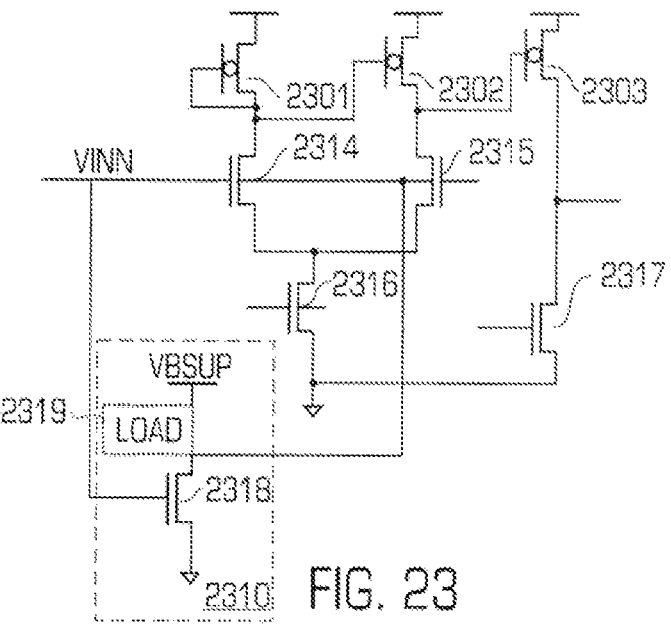
FIG. 23 is a schematic diagram illustrating a third embodiment of a differential amplifier of the sensing system of FIG. 19.

FIG. 23 is a schematic diagram illustrating a differential amplifier 2300. The differential amplifier 2300 comprises a plurality of PMOS transistors 2301 and 2302 and a plurality of NMOS transistors 2314, 2315 and 2316 arranged as a differential amplifier with differential pair input terminals coupled to the gates of the NMOS transistors 2314 and 2315. The gate of the NMOS transistor 2316 receives a bias signal. The differential amplifier 2300 further comprises a PMOS transistor 2303 and an NMOS transistor 2317 arranged as an output buffer stage. The gate of the NMOS transistor 2317 receives a bias signal. The differential amplifier 2300 further comprises an adaptive tracking circuit 2310 that provides n-pair body bias of the NMOS transistors 2314 and 2315. The tracking circuit 3210 provides an output bias that is a determined function of the input voltage (VINN). The transistors 2316 and 2317 may receive another bulk bias voltage. The tracking circuit 3210 comprises a loading circuit 2319 and an NMOS transistor 2318 that provides a bulk voltage on the bulk of the NMOS transistors 2314 and 2315. The gate of the NMOS transistor 2314 is biased by the input signal DINN, which is also applied to the gate of the NMOS transistor 2318.

Figure 24:
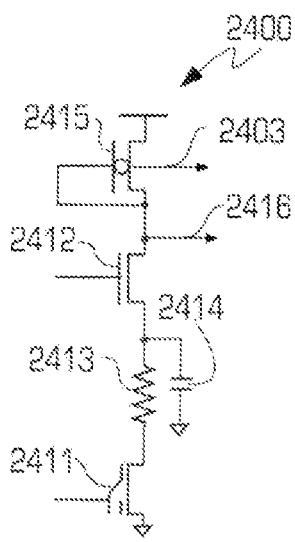
FIG. 24 is a schematic diagram illustrating a bitline sensing load circuit of the digital multilevel bit memory system of FIG. 1B.

FIG. 24 is a schematic diagram illustrating a bitline sensing load circuit 2400. The bitline sensing load circuit 2400 comprises a memory cell 2411 and an NMOS transistor 2412, and a PMOS transistor 2415. A bitline resistor 2413 is shown to indicate resistance on the bitline. A bitline capacitor 2414 is shown to indicate capacitance on the bitline. The bulk of the PMOS transistor 2415 is coupled to a bulk voltage terminal 2403 for receiving a voltage that may be different from the supply voltage or the same. The bulk voltage may be set as described above in conjunction with FIG. 3. In one embodiment, the bulk voltage is less than the voltage supply Vdd. In another embodiment, the bulk voltage is a bias voltage tracking forward pn diode voltage. The drain of the PMOS transistor 2415 is coupled to a bitline 2416.

Figure 25:
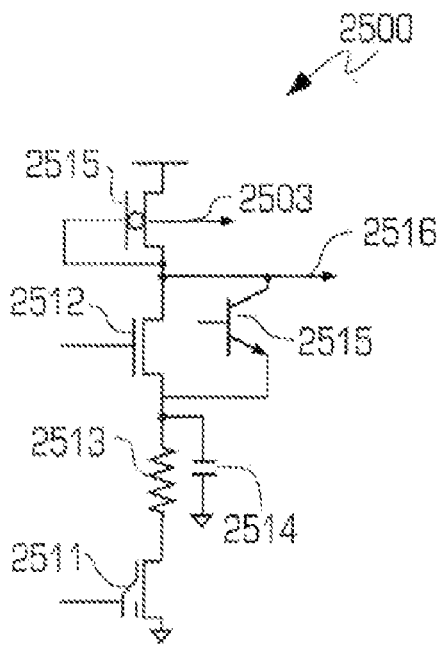
FIG. 25 is a schematic diagram illustrating a bitline sensing load circuit including a load transistor having parasitic bipolar action of the digital multilevel bit memory system of FIG. 1B.

FIG. 25 is a schematic diagram illustrating a bitline sensing load circuit 2500 including a load transistor having parasitic bipolar action. The bitline sensing load circuit 2500 comprises a memory cell 2511, an NMOS transistor 2512, and a PMOS transistor 2515. A bitline resistor 2513 is shown to indicate resistance on the bitline. A bitline capacitor 2514 is shown to indicate capacitance on the bitline. The drain of the PMOS transistor 2503 is coupled to a bitline 2516. An npn transistor 2515 is representative of an effective parasitic bipolar action on the NMOS transistor 2512 if the dimensions of the NMOS transistor 2512 are sufficiently small or the voltages applied thereto are sufficiently large, or a combination thereof, in a similar manner as the bipolar parasitic action described above.

Figure 26:
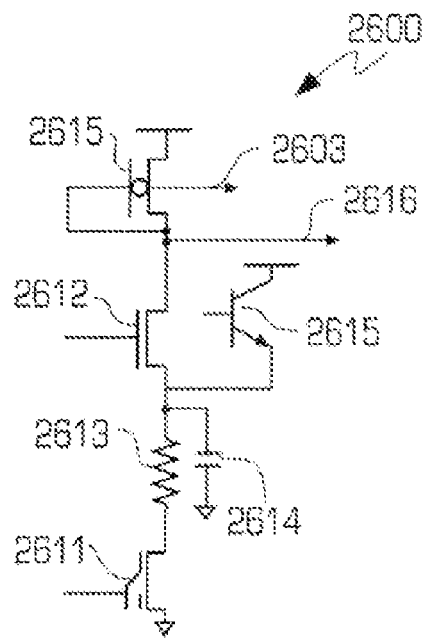
FIG. 26 is a schematic diagram illustrating a bitline sensing load circuit including a switch having parasitic bipolar action of the digital multilevel bit memory system of FIG. 1B.
Figure 27:
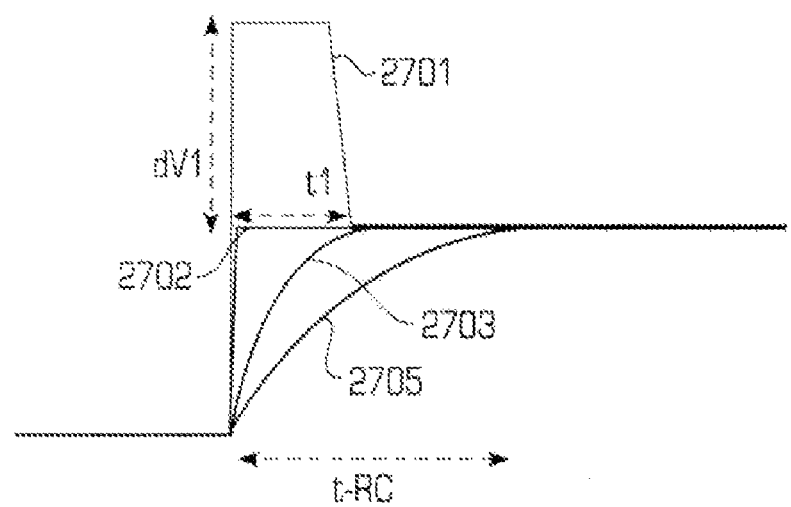
FIG. 27 is a timing diagram showing waveforms with pre-emphasis bitline driving in the bitline sensing load circuit of FIG. 26.

FIG. 26 is a schematic diagram illustrating a bitline sensing load circuit 2600 including a switch having parasitic bipolar action. The bitline sensing load circuit 2600 comprises a memory cell 2611, an NMOS transistor 2612, and a PMOS transistor 2615. A bitline resistor 2613 is shown to indicate resistance on the bitline. A bitline capacitor 2614 is shown to indicate capacitance on the bitline. The drain of the PMOS transistor 2603 is coupled to a bitline 2616. The bitline sensing load circuit 2600 further comprises an npn transistor 2615 that is used for predriving or providing preemphasis driving on the bitline by switching the collector of the transistor 2615 to be selectively coupled to the bitline 2616. FIG. 27 is a timing diagram showing waveforms with preemphasis bitline driving in the bitline sensing load circuit 2600. A predetermined voltage dV1 is overdriven over the final level V1 for a predetermined period t1 over t-RC to achieve preemphasis. A waveform 2701 having an overshoot dV1 and a pulse width t1 is substantially at the beginning of the bitline for driving with preemphasis. A waveform 2702 rising to V1 is substantially at the beginning of the bitline for driving without preemphasis. Waveforms 2703 and 2705 show 'preemphasis behavior' and 'normal RC behavior', respectively, substantially at the end of the bitline for driving with and without preemphasis respectively. If no preemphasis, the bitline may need several RC time constants to settle in a normal RC fashion. With optimized preemphasis, the bitline could settle in half the normal settling time. The voltage dV1 and the time t1 are determined based on characteristic of the effective bitline RC loading. These can be trimmed by electrical fuses (not shown) to optimize memory array organization. The bitline sensing load circuit 2600 uses charge precompensation to achieve equalization of the bitline (e.g., a RC line) in a shorter period of time. Similarly, this preemphasis bitline driving technique may be adapted to realize preemphasis wordline driving in the x-decoders of FIGS. 2,3,13, and 16. Similarly the preemphasis technique may be adapted to realize I/O buffer (IOBUF) driving for a particular system loading (IOBUF circuitry is part of the I/O Interface 196). In this case IOBUF circuitry can be configured by the logic controller 162 or by the microcontroller 20 to realize a particular preemphasis (dV1 and t1) depending on the characteristics (R,C,L) of the system and chip packaging loading that is driven by the IOBUF circuitry.

In one methodology, a memory operation is controlled for a memory, such as a Flash memory, by applying a preemphasis signal on a signal line coupled to the memory cells. In one embodiment, the preemphasis signal has at least one characteristic dependent on loading of the signal line. A memory operation, such as read or write, or a deselection of a group of memory cells, may then be performed.

In one embodiment, the preemphasis signal drives a voltage on the bit line to a negative voltage level for deselection of at least one of the memory cells. In another embodiment, the preemphasis signal drives a voltage on the signal line that is less than a forward bias pn junction voltage.

The biasing of the bulk voltages, parasitic bipolar action, preemphasis, and other methods and apparatus described above for a PMOS transistor may be similarly applied to an NMOS transistor, and similarly those described above for an NMOS transistor may be applied for a PMOS transistor. The techniques and schemes for a well driving and bias as described above may be used for other portions of the micro controller memory system 100 or the type memory system 100 such as the high voltage regulation, timing, bandgap references, I/O buffering described above.

The body voltage described above may be driven to forward bias pn junctions in the MOS transistors or to reverse bias pn junctions in the MOS transistors or combinations thereof. For example, the voltage on an n-well of a PMOS transistor higher than the source voltage of the PMOS transistor, for example, to reduce leakage current. In one embodiment, the local selective bulk voltage is realized as a chip function or performance (such as speed). For example in one embodiment, an n-well bulk voltage of the sensing, wordline and bitline decoding, and IO circuitry is driven higher than Vdd in erase or program operation to reverse bias the sensing, decoding, and IO PMOS transistors during program and erase to reduce leakage because the sensing function or fast speed transistor is not used during these operations. In another embodiment, an n-well bulk voltage of the HV (high voltage) control circuitry is driven higher than Vdd in read operation to reverse bias the HV control PMOS transistors during read to reduce leakage since the HV function is not used during this operation. In another embodiment, n-well bulk voltage of the sensing, wordline and bitline decoding, IO circuitry is driven same as the supply voltage Vdd for medium or slow speed or for higher power supply Vdd level (such at the beginning of the battery operation, at the end the Vdd level is typically lowered). Similarly bulk voltage for NMOS can be realized as a function or performance of chip.

In another embodiment, the body voltage may be driven to reverse-bias or forward bias to modulate the threshold voltage Vt to be higher or lower, so as to increase the input common mode range of an NMOS input pair of a differential amplifier, such as the differential amplifiers 2100, 2200 and 2300, or an operational amplifier (op amp). This is done for example, as the input common range level is at the low level, the threshold voltage Vt of an NMOS input pair is modulated to be lowered (accordingly, the NMOS input pair is turned on because the threshold voltage Vt is lower). As the input common range level is at the high level, the threshold voltage Vt of NMOS input pair is modulated to be higher (accordingly the NMOS input pair is kept in saturation region at high level because it is harder to put it into linear region since the threshold voltage Vt is higher). As the input common range level is at the high level, the threshold voltage Vt of the PMOS transistor can be modulated to be lowered to increase the headroom voltage higher for the drain side of the NMOS input pair. The end effect is that the differential amplifiers or the op amp have a more effective input common mode range.

The tracking bias voltage generators may be local to the MOS transistors that include a bulk coupled to the tracking bias voltage generators. For example, the decoders 304 and/or word line drivers 306 may include the tracking bias voltage generators. As an illustrative example, a tracking bias voltage generator is local to the MOS transistor, such as the tracking p-region load body bias circuit of the differential amplifier 2200. As an another illustrative example, each of a plurality of voltage generators 400 is local to a corresponding one of the PMOS transistors 361, each of another plurality of voltage generators 400 is local to a corresponding one of the PMOS transistors 371. In another embodiment, the tracking bias voltage generators are physically local to the corresponding MOS transistors in the integrated circuit. As an illustrative example, the tracking p-region load body bias circuit of the differential amplifier 2200 is adjacent the PMOS transistor 2202.

In the foregoing description, various methods and apparatus, and specific embodiments are described. However, it should be obvious to one conversant in the art, various alternatives, modifications, and changes may be possible without departing from the spirit and the scope of the invention which is defined by the metes and bounds of the appended claims.

What is claimed is:

1. A decoder for flash memory comprising:
   a voltage supply terminal for coupling to a first voltage source;
   a plurality of MOS type transistors arranged in a plurality of decoding circuits to generate a plurality of enable signals in response to a plurality of control signals, each of the MOS type transistors including a substrate voltage terminal for selective coupling to a second voltage source, the second voltage source having a voltage different than the first voltage source and having a voltage different than ground, each decoding circuit generating a corresponding one of the plurality of enable signals, the substrate voltage terminals of a selected decoder being coupled to the second power source, the substrate voltage terminals of unselected decoders being coupled to the first power source;
   the plurality of decoding circuits include a virtual ground voltage terminal,
   a plurality of bulk voltage generators coupled to the substrate voltage terminals of a corresponding one of the plurality of decoding circuits for providing a first voltage in response to an enable signal corresponding to the plurality of control signals and providing a second voltage in response to an disable signal corresponding to the plurality of control signals; and
   a selection circuit for selectively coupling the virtual ground voltage terminal of a selected decoding circuit to a voltage source providing a first voltage less than a ground voltage and coupling the virtual ground voltage terminal of unselected decoding circuits to a voltage source providing a second voltage less than a ground voltage.

2. The decoder of claim 1 wherein the first and second voltages track a forward bias pn diode voltage.

3. The decoder of claim 1 wherein the first and second voltages are less than a bias voltage tracking forward bias pn diode voltage.

4. The decoder of claim 1 further comprising a plurality of bulk voltage generators coupled to the substrate voltage terminals of a corresponding one of the plurality of decoding circuits for providing a first voltage in response to an enable signal corresponding to the plurality of control signals and providing a second voltage in response to an disable signal corresponding to the plurality of control signals.

5. The decoder of claim 4 wherein the second voltage tracks a forward bias pn diode voltage.

6. The decoder of claim 4 wherein the second voltage is less than a bias voltage tracking forward bias pn diode voltage.

7. The decoder of claim 1 wherein the voltage of the second voltage source sets a bias voltage across pn junctions of the MOS transistor at a level, defined by a predetermined current level, above a pn junction diode voltage.

8. The decoder of claim 1 further comprising a voltage generator coupled to the second voltage terminal to generate the second voltage to set a bias voltage across pn junctions of the MOS transistor at a level, defined by a predetermined current level, above a pn junction diode voltage.

9. The decoder of claim 8 wherein the voltage generator comprises a PMOS transistor including first and second terminals with a channel therebetween and including a gate for controlling current in said channel and including a bulk voltage terminal, the first terminal and the gate being coupled to the first voltage source, the second terminal and the bulk being coupled to a bias voltage terminal for coupling to the substrate voltage terminal of the selected decoder, and further comprising a current source including first and second terminals coupled to the second terminal of the PMOS transistor and a ground terminal, respectively.

10. The decoder of claim 1 wherein the voltage of the second power source sets a bias voltage across pn junctions of the MOS transistor at a level below a pn junction diode voltage.

11. The decoder of claim 1 wherein the voltage of the second power source sets a bias voltage across pn junctions of the MOS transistor as a ratio of a pn junction diode voltage.

12. The decoder of claim 1 wherein the ratio is less than one.

13. The decoder of claim 1 wherein the ratio is greater than one.

14. The decoder of claim 1 further comprising a voltage generator coupled to the second voltage terminal to generate the second voltage to set a bias voltage across pn junctions of the MOS transistor at a level below a pn junction diode voltage.

15. The decoder of claim 14 wherein the voltage generator comprises a resistor including a first terminal and including a second terminal coupled to a bias voltage terminal, and further comprising a current source including first and second terminals coupled to the second terminal of the resistor and a ground terminal, respectively.

16. The decoder of claim 15 wherein the current source comprises:
a current mirror.

17. The decoder of claim 15 wherein the current source comprises a first PMOS transistor including first and second terminals with the channel therebetween and including a gate for controlling current in said channel, the first terminal being coupled to a supply voltage, the second terminal being coupled to the gate;
a first NMOS transistor including first and second terminals with the channel therebetween and including a gate for controlling current in said channel, the first terminal being coupled to the second terminal of the first PMOS transistor;
a second PMOS transistor including first and second terminals with the channel therebetween and including a gate for controlling current in said channel and including a bulk voltage terminal, said first terminal being coupled to the second terminal of the first NMOS transistor, said second terminal of the second PMOS transistor being coupled to the ground terminal, said gate of said first PMOS transistor being coupled to the first terminal of the second PMOS transistor, said bulk terminal being coupled to the ground terminal;
a third PMOS transistor including first and second terminals with a channel therebetween and including a gate for controlling current in said channel, the first terminal being coupled to the first power source, the second terminal being coupled to said gates of the first and third PMOS transistors;
a second NMOS transistor including first and second terminals with a channel therebetween and including a gate for controlling current in said channel, said first terminal being coupled to the second terminal with the third PMOS transistor, said gate being coupled to the gate of the first NMOS transistor; and
a resistor including a first terminal coupled to the second terminal of the second NMOS transistor and including a second terminal coupled to the ground terminal.

18. The decoder of claim 1 further comprising a bulk voltage generator coupled to the substrate voltage terminals for providing a first voltage in response to an enable signal corresponding to the plurality of control signals and providing a second voltage in response to a disable signal corresponding to the plurality of control signals.

19. A decoder for flash memory comprising:
a level-shift circuit including an output for providing a voltage signal having a level above a supply voltage applied to said decoder;
a drive circuit coupled to receive to the output of the decoding circuit, the drive circuit including a MOS transistor that includes a substrate voltage terminal for receiving a voltage different from the supply voltage and the level shifted voltage on the output of the decoder circuit;
a voltage generator coupled to the substrate voltage terminal, the voltage generator comprising:
a first voltage divider including an output coupled to the substrate voltage terminal;
a capacitor divider coupled across the first voltage divider; and
a second voltage divider including an output for providing a voltage; and
a switch for selective coupling the output of the second voltage divider to the capacitor divider.

20. The decoder of claim 19 wherein an output of the driver circuit is coupled to a wordline terminal for applying a drive voltage to said terminal in response to a word line selection signal.

21. The decoder of claim 19 wherein the MOS type transistor has a bipolar transistor relationship between drain source and gate terminals thereof.

* * * * *